(12) United States Patent
Krasowski et al.

(10) Patent No.: US 11,128,293 B1
(45) Date of Patent: Sep. 21, 2021

(54) COMPENSATION FOR DEVICE PROPERTY VARIATION ACCORDING TO WAFER LOCATION

(71) Applicant: United States of America as represented by the Administrator of NASA, Washington, DC (US)

(72) Inventors: Michael J. Krasowski, Cleveland, OH (US); Norman F. Prokop, Cleveland, OH (US); Philip G. Neudeck, Cleveland, OH (US); David J. Spry, Cleveland, OH (US)

(73) Assignee: United States of America as Represented by the Administrator of National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 16/939,612

(22) Filed: Jul. 27, 2020

Related U.S. Application Data

(60) Provisional application No. 62/879,108, filed on Jul. 26, 2019.

(51) Int. Cl.
*H03K 17/14* (2006.01)
*H03K 17/30* (2006.01)
*H01L 29/808* (2006.01)
*H01L 29/16* (2006.01)
*H03K 17/12* (2006.01)

(52) U.S. Cl.
CPC ......... *H03K 17/30* (2013.01); *H01L 29/1608* (2013.01); *H01L 29/808* (2013.01); *H03K 17/12* (2013.01)

(58) Field of Classification Search
CPC .............................. H03K 17/14; H03K 17/30
USPC ................................................... 327/430, 512
See application file for complete search history.

(56) References Cited

U.S. PATENT DOCUMENTS 7,439,791 B2 * 10/2008 Moosa ................. H03K 17/145
327/512
8,552,795 B2 * 10/2013 Chi ................... H03K 19/00384
327/543

\* cited by examiner

*Primary Examiner* — Hai L Nguyen
(74) *Attorney, Agent, or Firm* — Robert H. Earp, III; Mark Wolfgang; Helen M. Galus

(57) ABSTRACT

Methods and devices are disclosed for compensating for device property variations across a wafer. The method comprises determining an output of a first device based on an input and determining an output of a second device based on the input. The second device is located at a different position with respect to a center of the wafer than a position of the first device with respect to the center of the wafer. The method further comprises determining a difference between the output of the first device and the output of the second device, the difference arising at least in part from the difference in position of the first and second devices. The method further comprises altering the first device such that the output of the first device based on the input substantially matches the output of the second device based on the input.

20 Claims, 30 Drawing Sheets

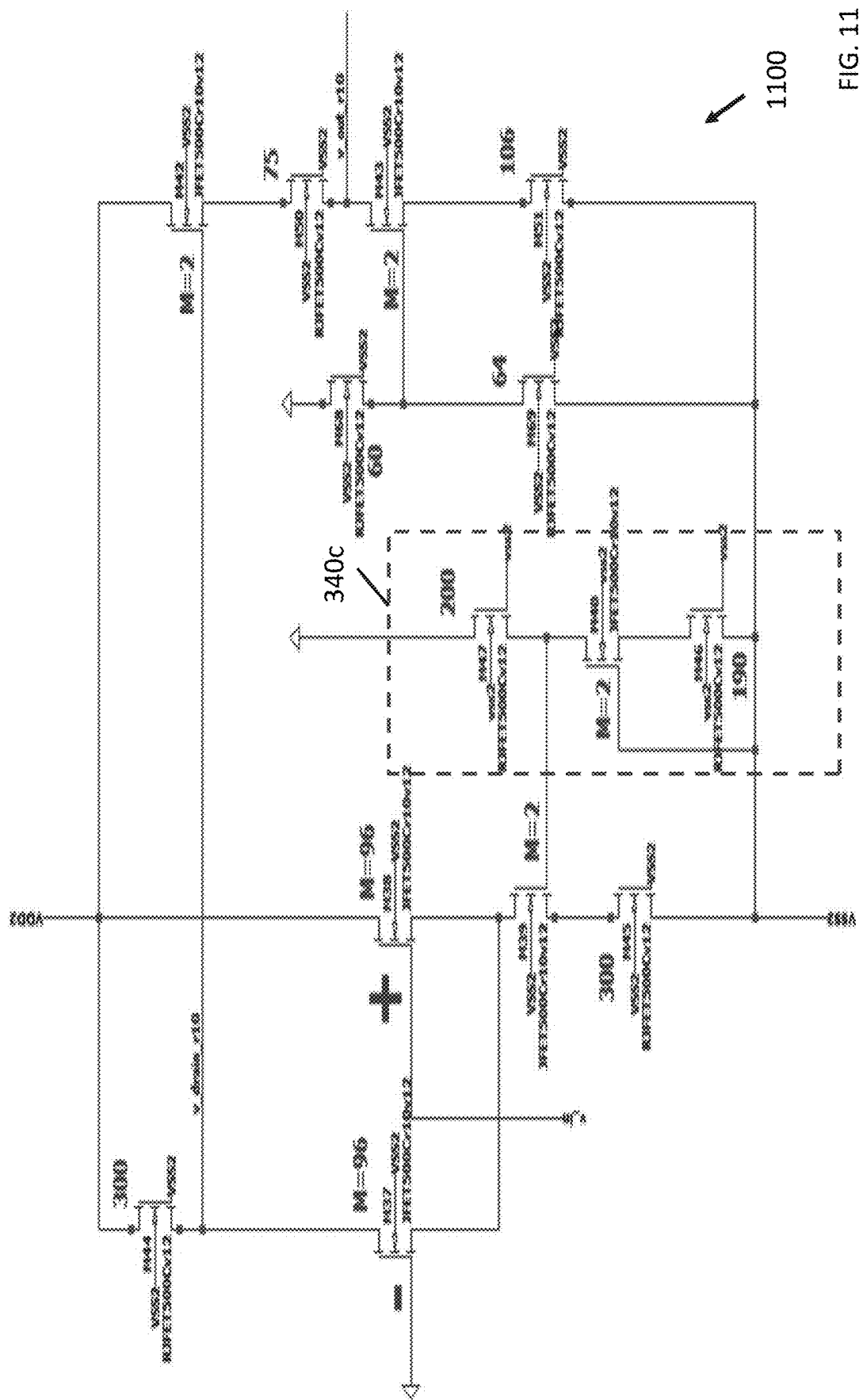

COMPENSATION FOR DEVICE PROPERTY VARIATION ACCORDING TO WAFER LOCATION

CROSS-REFERENCE TO RELATED APPLICATIONS

This application claims the benefit of U.S. Provisional Application No. 62/879,108, filed Jul. 26, 2019, the entire contents of which are incorporated herein by reference.

ORIGIN OF INVENTION

Government for governmental purposes without the payment of any royalties thereon or therefor. The invention described herein was made in the performance of work under a NASA contract, and is subject to the provisions of Public LAW 96-517 (35 USC 202) in which the Contractor has elected not to retain title.

FIELD OF DISCLOSURE

This disclosure relates to devices, particularly amplifiers, fabricated on wafers, such as wafers of SiC. The disclosure relates more particularly to techniques, methods, and circuit designs that can compensate for inhomogeneities in device properties occurring when devices are fabricated on different portions of the wafers.

BACKGROUND

Certain devices fabricated on silicon-based wafers can have properties that depend on the area or portion of the wafer on which they are fabricated. For example, the same amplifier fabricated close to the center of the wafer may produce a different output (e.g., gain) in response to the same input as its counterpart fabricated near the wafer's edge. This can happen for a number of reasons, including that the properties (e.g., chemical and/or surface properties) of the wafer itself having lateral inhomogeneities. Devices formed by epitaxial layer growth on the wafer may be subject to these changes in wafer properties including epitaxial layer doping and layer thickness known in the art. In addition or alternatively, epitaxial processes that create device layers may themselves vary when applied at different parts of the wafer.

The inhomogeneities can lead to a lack of a precise understanding and control of device properties. In some cases, they may result in devices being inadvertently be driven under inappropriate conditions (e.g., excessive input currents, etc.) Such can lead to out-of-specification components, and even system-wide failures.

Electronic Components Formed on SiC Wafers

SiC wafers can be used to form electronic components in lieu of using traditional Si (or other) wafers. In particular, SiC is suitable for applications requiring high temperature and/or high voltage performance specifications beyond those that can be realized with silicon-based devices. SiC's relatively wider band gap energy, lower intrinsic carrier concentration, higher breakdown electric field, higher thermal conductivity, and lower chemical reactivity means that SiC devices can operate under higher electric fields and higher temperatures advantageous to various electronic systems. This can improve device and component integrity under extreme conditions. SiC wafers also tend to have high resistance to thermal shock, meaning they can operate under harsh conditions without breaking or cracking.

Yet electrical devices formed on SiC substrate can be subject to the property variations described above. Epitaxial layer or other inhomogeneities on the wafer can alter performance to devices fabricated on different portions of the wafer. For example, field effect transistors (FETs) requiring channel grown epitaxially (e.g., silicon carbide (SiC) n-channel depletion mode junction field effect transistors (JFETs), which require an epitaxially grown n-channel) may have key device properties quantitatively undesirably vary with wafer position. These JFETs can have different zero body-bias threshold voltages (VTOs) resulting in different threshold voltages (VTs) depending on die position relative to the distance from the center of the wafer. Authors observed (including in Ref. [P1]) that, in such systems, as die extraction extends from the center of the die towards the edge of the wafer, the magnitude of VTO/VT increases. Such variations in VTO/VT can degrade device performance and/or make device performance less predictable which in turn can make circuit implementation and manufacturing yield more challenging to accomplish.

FET Current Source

FIG. 1 shows a common n-type FET current source. Specifically, an n-type, depletion mode FET ("Q") is configured to self-bias (i.e., by connecting its gate terminal (G) to source (S)) to produce a constant drain (D) current $I_d$. $I_d$ is closely approximated by Equation 1:

$$I_d = KP \cdot (V_{gs} - VT)^2 \qquad \text{(Equation 1)}$$

where KP is the transconductance of the FET Q in A/V$^2$, VT is the threshold voltage of the FET Q at a given (not necessarily zero) body bias and $V_{gs}$ is $I_d$ times the value of resistor R in the source circuit. Thus, for a given FET, Equation 1 shows that $I_d$ is both a function of R and VT, both of which may vary on the surface of a SiC or other wafer.

TABLE 1 shows measured variation of $I_d$ in commercial FET current sources/current limiters across Diode Part Numbers, which vary in distance from the center of the wafer.

TABLE 1

Current Regulator Diodes, CR160 Series Datasheet, Document Number 91000, Vishay Siliconix, 18 Jul. 2008.

| Diode Part Number | $I_d$ $V_F$ = 25 V mA | | |
|---|---|---|---|
| | Min | Nom | Max |
| CR160 | 1.440 | 1.60 | 1.760 |
| CR180 | 1.620 | 1.80 | 1.980 |
| CR200 | 1.800 | 2.00 | 2.200 |
| CR220 | 1.960 | 2.20 | 2.420 |
| CR240 | 2.160 | 2.40 | 2.640 |
| CR270 | 2.430 | 2.70 | 2.070 |
| CR300 | 2.700 | 3.00 | 3.300 |
| CR330 | 2.970 | 3.30 | 3.630 |
| CR360 | 3.240 | 3.60 | 3.960 |
| CR390 | 3.510 | 3.90 | 4.290 |
| CR430 | 3.870 | 4.30 | 4.730 |
| CR470 | 4.230 | 4.70 | 5.170 |

The diode part numbers in Table 1 refer to diodes produced across production die "lots." The die lots are differently located from the center of the wafer. Therefore, the observed correlation of $I_d$ with Diode Part Numbers likely indicates inhomogeneities in $I_d$ (and VT, according to Equation 1) across the wafer. Since differences in $I_d$ correlate to differences in performance of the diodes, these results show that diode produced on different parts of the wafer will perform differently.

The data in Table 1 demonstrate a need for methods that compensate for changes in device properties that may occur in different portions of the wafer and temperature. Understanding how to provide such compensation could facilitate devices that operate similarly regardless of temperature or radius.

SUMMARY

Compensation methods and devices are illustrated and analog and mixed signal constructs are developed for addressing property variation in devices fabricated on a wafer. Although examples are given that apply specifically to devices fabricated on SiC wafers, it is to be understood that the principles and methods described herein are general. They may apply to other types of devices constructed on other types of wafers, including more traditional Si wafers.

A method is disclosed herein for compensating for device property variations across a wafer. The method comprises determining an output of a first device based on an input and determining an output of a second device based on the input, the second device located at a different position with respect to a center of the wafer than a position of the first device with respect to the center of the wafer. The method further comprises determining a difference between the output of the first device and the output of the second device, the difference arising at least in part from the difference in position of the first and second devices. The method further comprises altering the first device such that the output of the first device based on the input substantially matches the output of the second device based on the input. The altering may comprise biasing a voltage input to the first device or adding a current source to the first device. The altering may be based on compensating for differences in properties of the wafer at the position of the first device from properties of the wafer at the position of the second device. The differences in properties may be differences in chemical properties of the wafer. The first and second devices may comprise amplifiers. The wafer may comprise SiC. The difference between the output of the first device and the output of the second device may arise at least in part from a difference in a threshold voltage for the first device and a voltage threshold for the second device.

This disclosure further describes a device designed by a method comprising determining an output of a first device based on an input. The method further comprises determining an output of a second device based on the input, the second device located at a different position with respect to a center of a wafer than a position of the first device with respect to the center of the wafer. The method further comprises determining a difference between the output of the first device and the output of the second device, the difference arising at least in part from the difference in position of the first and second devices. The method further comprises altering the first device such that the output of the first device based on the input substantially matches the output of the second device based on the input. The altering may comprise biasing a voltage input to the first device or adding a current source to the first device. The first and second devices may comprise amplifiers such as one or more operational amplifiers. The wafer may comprise SiC. The difference between the output of the first device and the output of the second device may arise at least in part from a difference in a threshold voltage for the first device and a voltage threshold for the second device. The outputs of the first and second device may depend on a current, e.g., drain current, associated with a device.

These and other embodiments of the invention are described in detail below.

BRIEF DESCRIPTION OF DRAWINGS

FIG. 11 shows application of similar current source biasing to an open loop operational amplifier 1100 at T=500° C. and r=10 mm, incorporating the circuit 340c from FIG. 5.

DETAILED DESCRIPTION

Figure 1:
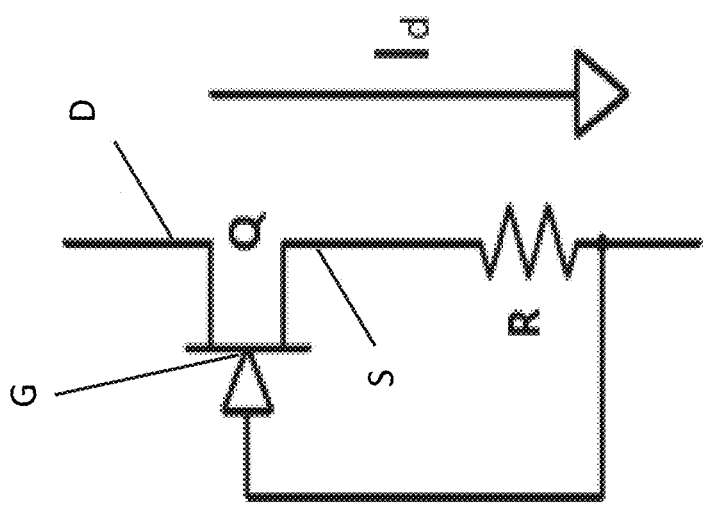
FIG. 1 shows an exemplary embodiment of an n-type FET current source.

Determination of Drain Voltage Dependency on Wafer Location

In order to inform their compensation methods and circuits, Authors performed simulations in the LTspice platform. The simulations model JFET and resistor ("RJFET")

performance at differing distances from the center of a SiC wafer and different temperature.

The Authors' first simulation explores $I_d$ through a SiC JFET as a function of sweeping the difference between the gate to source voltage ($V_{gs}$). FIGS. 2A-2D show the circuit topographies for this first test. Common source circuits 210, 220, and 230 in FIG. 2A, reflect a 25° C. models of components (JFETs and resistors) at distances from center of SiC wafer (herein referred to as "radius") of 10 mm, 20 mm, and 30 mm respectively. Common source circuits 240 and 250 in FIG. 2B, reflect a 300° C. model at a radius of 10 mm and 20 mm, respectively. Common source circuits 260 and 270 in FIG. 2C, reflect a 460° C. model at a radius of 10 mm and 20 mm, respectively. Common source circuits 280, 290, and 295 in FIG. 2D, reflect a 500° C. model at a radius of 10 mm, 20 mm, and 30 mm respectively. In the study, $V_{gate}$ in circuits 210-295 was swept from −2 to −12 V.

Components in FIGS. 2A-2D are represented in LTspice using the NASA GRC SiC "NASA Glenn 500" C Durable JFET Technical User Guide.[1] The details of the models for both JFETs and are described in Exhibit A. Briefly, SiC JFETs and SiC resistors are modeled in LTspice simulations using NMOS (n-type MOSFET) parameterization. The use of a MOSFET to model JFETs and resistors is purely an expedient, and an artifact of the modeling process. The LTspice MOSFET models offers sufficient latitude with regard to parameterization to represent the complexity of JFET and resistor response to radius and temperature. The JFET and resistor components being simulated do not have MOSFET structures. Rather, they have typical JFETs and resistor structures. Use of MOSFET parameterization is not to be taken as implying anything about the structure of the JFETs and resistors being modeled.

https://sic.grc.nasa.gov/jfetictechguide/

The model parameterizes JFET properties for both radius and temperature. See, e.g., Exhibit A at 12. In other words, properties of JFETs that vary with radius and temperature are directly added to the n-type MOSFET model in LTspice simulations such that the model performs as the JFET would at a particular radius and temperature. Similarly, resistor property variation with temperature is parameterized using the same n-type MOSFET models in LTspice simulations as for the JFETs, as described above. Due to the fabrication process employed present studies, resistor resistances possess minimal variation with radius and, therefore, are not parameterized by radius.

In the figures that accompany this disclosure, JFET models are given the name JFETTTTCRRv12, where ITT is temperature in ° C., and RR is radius in mm. Resistor models in schematics are given as RJFETTTTCv12, where TTT is temperature in ° C. "v12" stands for version 12. It refers to the model version used, as described in Exhibit A.

In FIGS. 2A-3D, JFET and Resistor components are represented with standard JFET and resistor symbols respectively. However, in FIGS. 3E-11, both JFET and resistor models are represented the LTspice program symbol for n-type MOSFETs that was used to generate the simulation results. The latter symbolic representation is simply a modeling expedient/artifact and, as discussed above, not meant to imply anything about the structure of the JFETs or resistors being modeled. Despite their symbolic representation, JFETs and resistors in FIGS. 3E-11 have standard structure, the same structure as the JFETs and resistors in FIGS. 2A-3D. The same labeling scheme described above is also used in FIGS. 3E-11 to identify these components. See, e.g., see FIG. 6 with JFET500Cr10v12 (M39), which is a model of a JFET located at a radius of 10 mm and operating at 500° C. Despite their different symbols, JFET500Cr10v12 (M39) in FIG. 6 has the same model as JFET500Cr10v12 (M1) in FIG. 2D. FIG. 6 also shows a RJFET500Cv12 (M7). The latter is a model of a resistor operating at a temperature of 500° C. Despite their different symbols, RJFET500Cv12 (M7) in FIG. 6 has the same model as RJFET500Cv12 (M19) in FIG. 2D. Both JFET500Cr10v12 (M39) and RJFET500Cv12 (M7) are represented in FIG. 6 using the n-type MOSFET symbol purely for convenience sake.

Figure 2A:
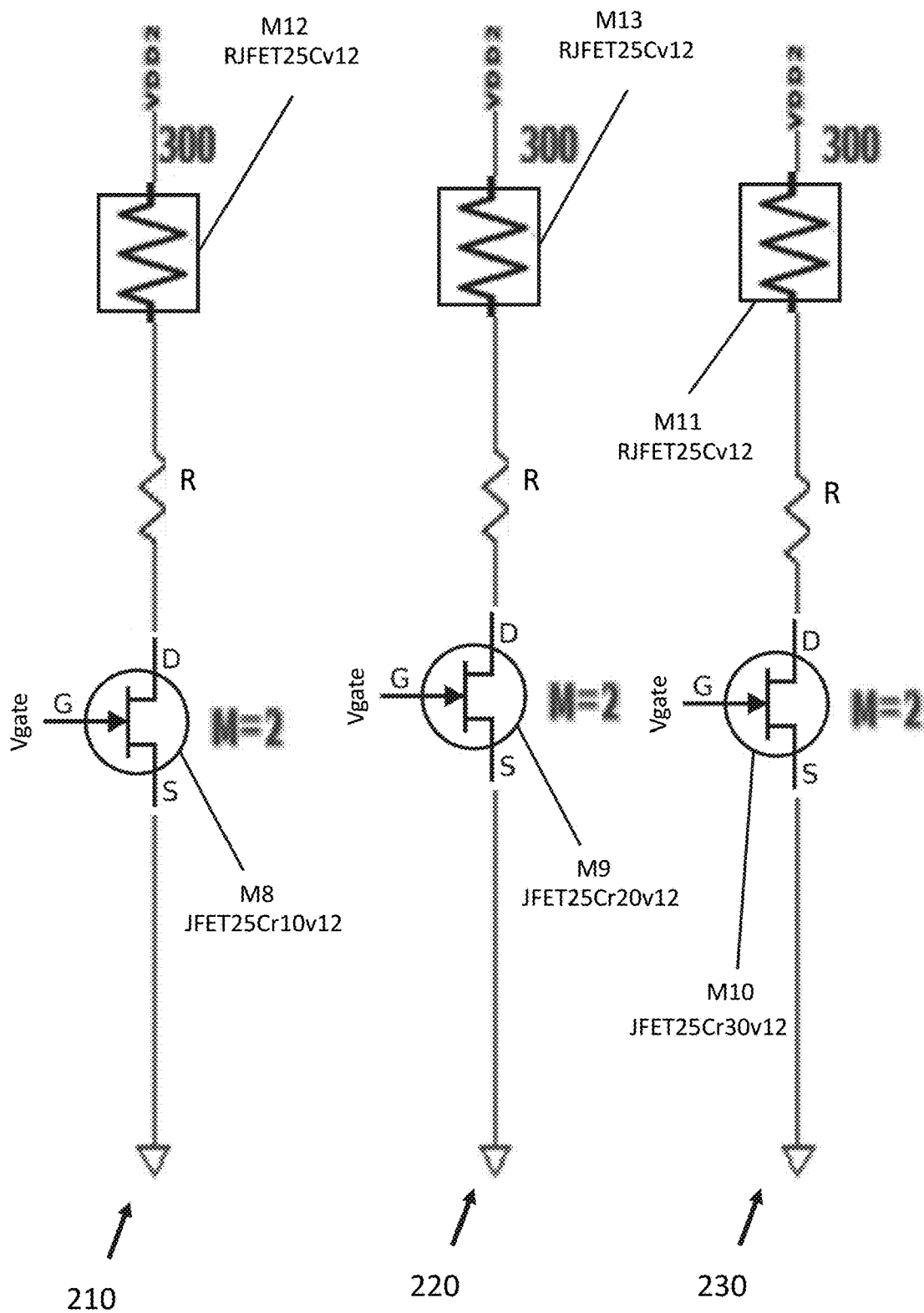
FIGS. 2A-2D show the circuit topographies for testing model JFET and resistor ("RJFET") performance at differing distances from the center of a SiC wafer and different temperature.
Figure 2B:
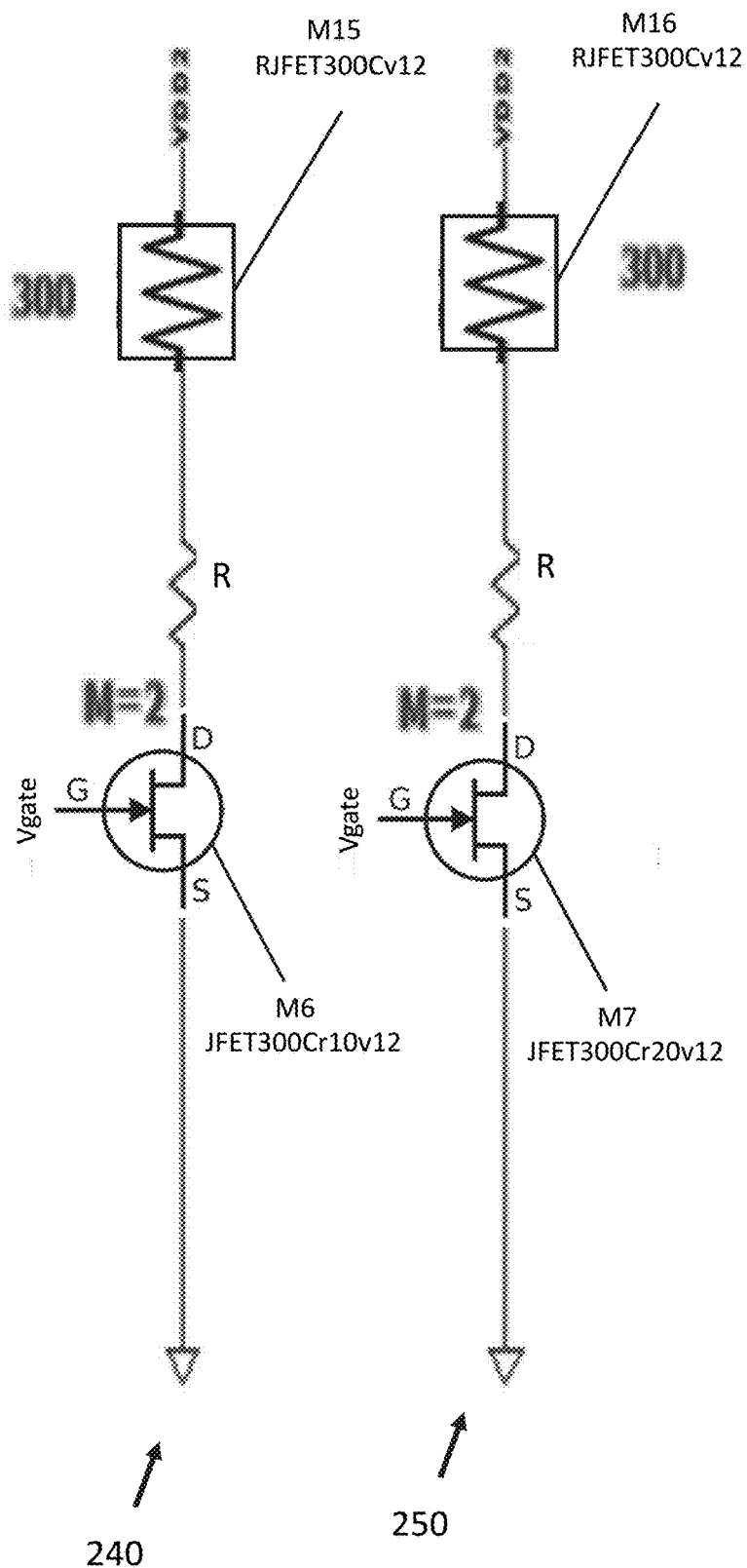
Figure 2C:
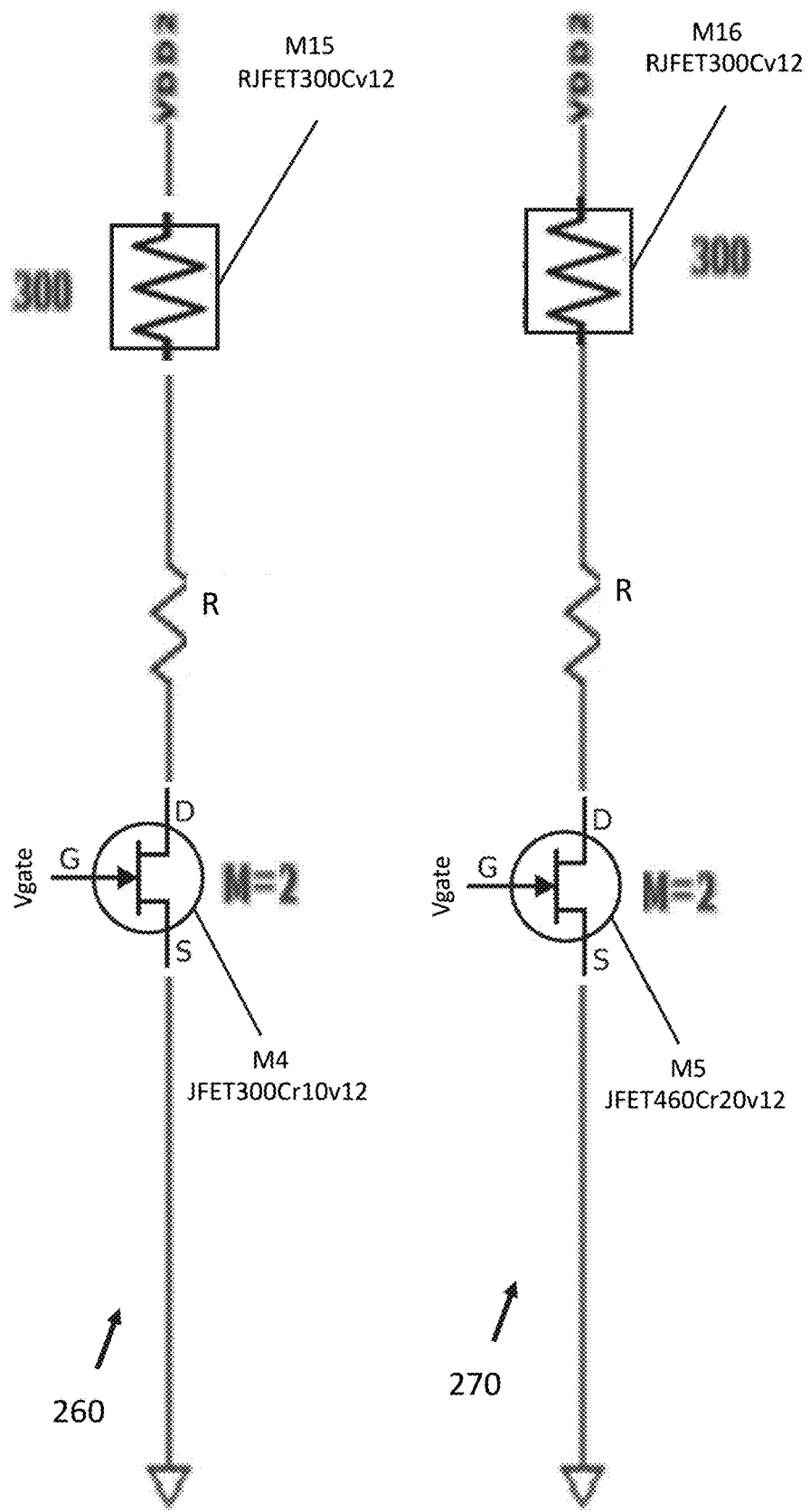
Figure 2D:
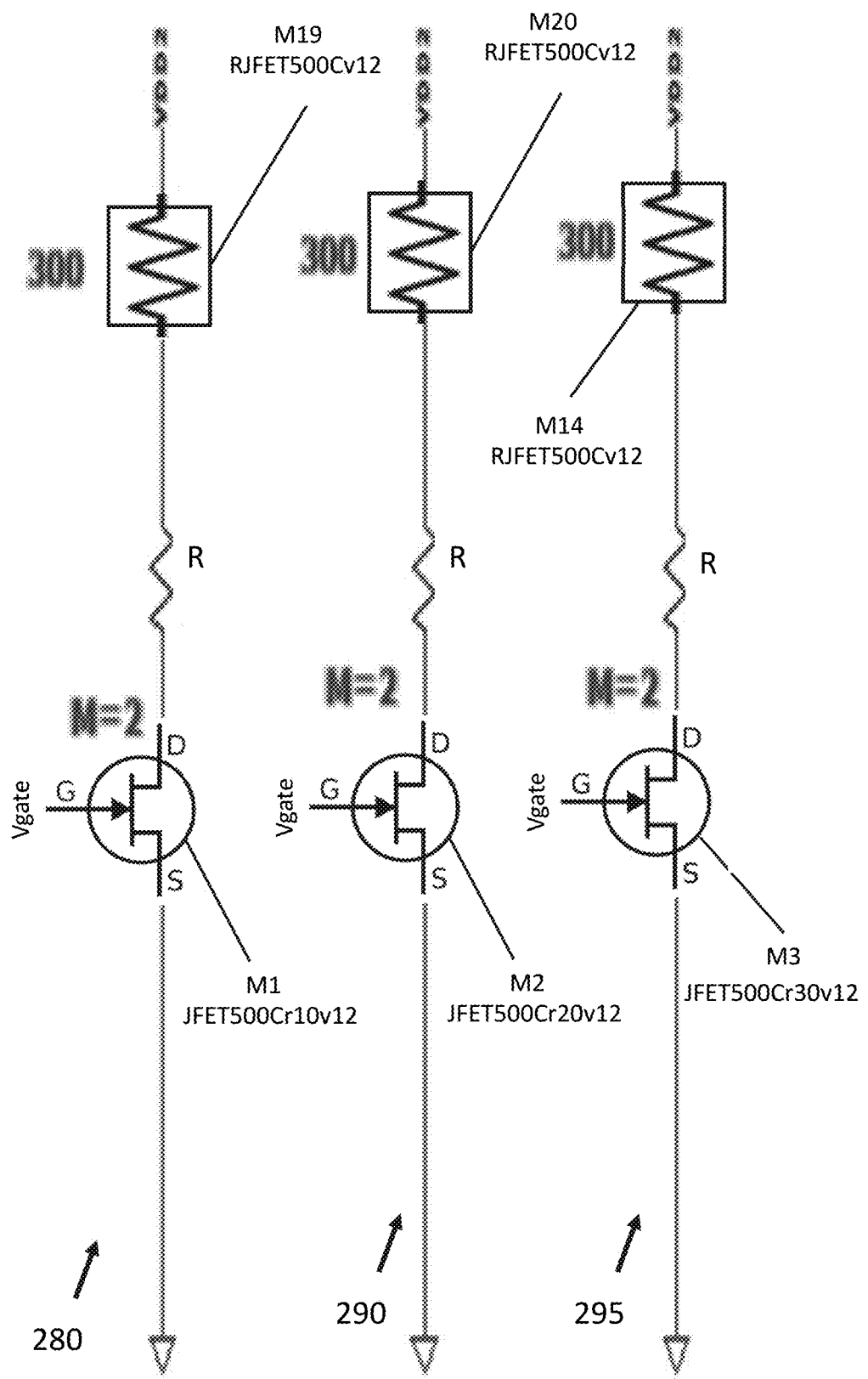

In the figures of this disclosure, each JFET is given a unique, individual designation that has the format "MX," where "X" is an individual JFET designation number. For example, the three JFETs in FIG. 2A, JFET25Cr10v12, JFET25Cr20v12, and JFET25Cr30v12, are designated M8, M9, and M10, respectively. The JFETs in the figures herein also include a separate "M" designation, which describes the number of singular "unit-layout-cell" devices in parallel. Details for an exemplary unit-layout-cell device are provided at p. 13 of Exhibit A. For example, the three JFETs in FIG. 2A are all "M=2" modules which means that each individual transistor is comprised of two active devices in parallel. Page 13 of Exhibit A illustrates the physical layout of an "M=4" JFET comprised of 4 unit-layout-cell modules. Additional details are explained in Exhibit A.

In the figures of this disclosure, each resistor (or RJFET) is given a unique, individual designation that also has the format "MX," where "X" is an individual resistor designation number. The three resistors in FIG. 2A, for example, each labeled RJFET25Cv12, are designated M11, M12, and M13. Note that the resistor types are the same at each radius, r=10, 20, and 30 mm, because resistor resistance values vary with temperature, not radius. The resistors in the figures herein also include a numerical value that corresponds to the "number of squares," contained in the physical layout of the resistor. The overall resistance of the resistor scales with the number of squares. For example, the three resistors in FIG. 2A, each resistor labeled RJFET25Cv12, all have value "300," or 300 squares. The three top resistors in FIG. 3F, RJFET25Cv12 (M88), RJFET25Cv12 (M91), and RJFET25Cv12 (M92), are, like the resistors M11, M12, and M13 of FIG. 2A, models of resistance at T=25° C. However, the three resistors M88, M91, and M92 of FIG. 3F are labeled "150" because they have half as many squares in their physical layout as the resistors M11, M12, and M13, which are labeled as "300." As an example, a RJFET500Cv12 single-square resistor, referenced to ground, substrate and gate tied to −25 Volts, with 1 µAmp of current flowing through it, represents approximately 20,733Ω. Note that the electrical bias (potential) of a resistor in a circuit relative to the wafer/substrate electrical bias (potential) affects its actual resistance value due to body effect to be described below. However, it is to be understood that the relationship between the number of squares and actual resistance depends on the specific component. This relationship is not unique to this disclosure. The disclosure may apply to different components and different component types than the ones described explicitly herein.

Figure 2E:
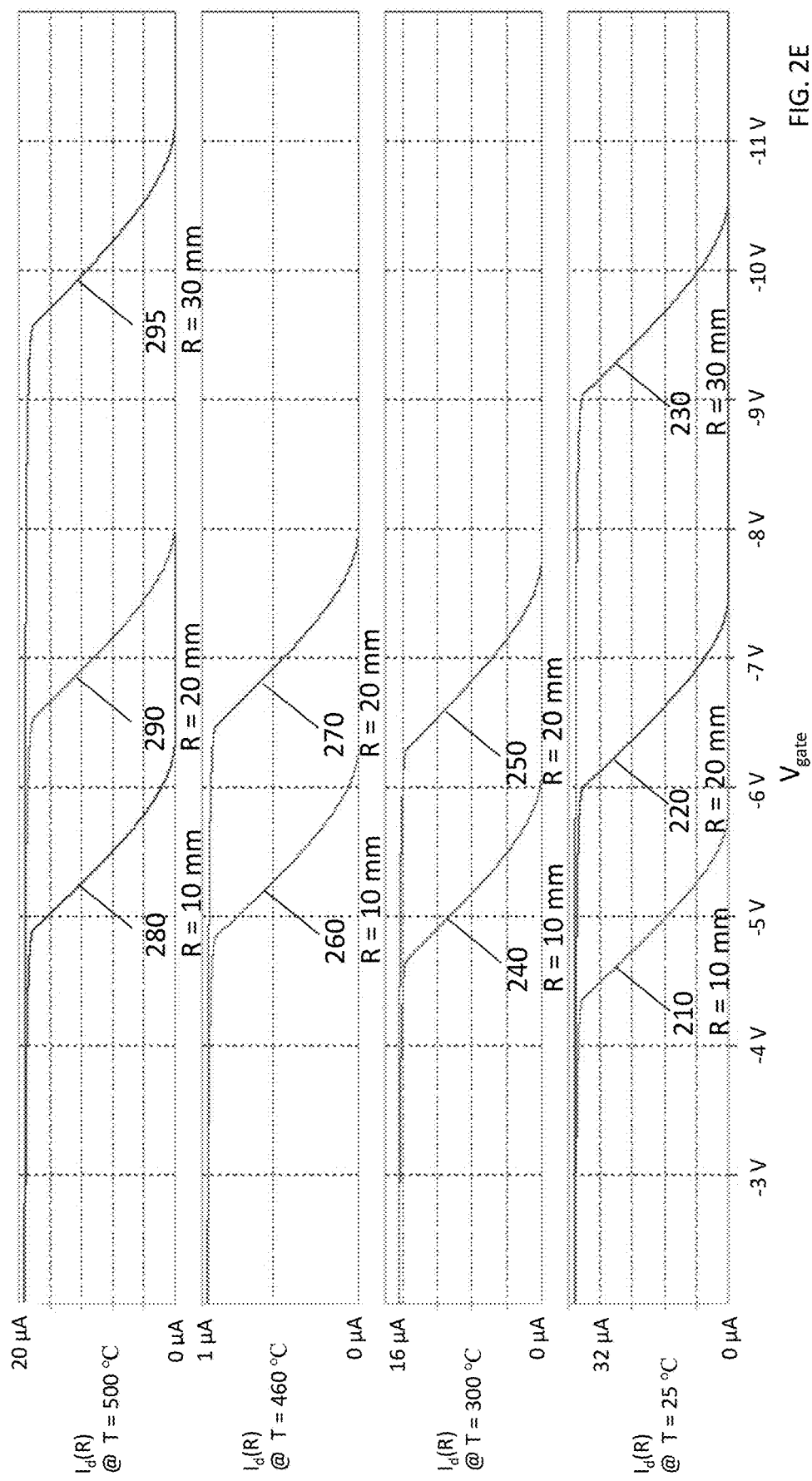
FIGS. 2E and 2F show results of simulations involving the circuits in FIGS. 2A-2D.
Figure 2F:
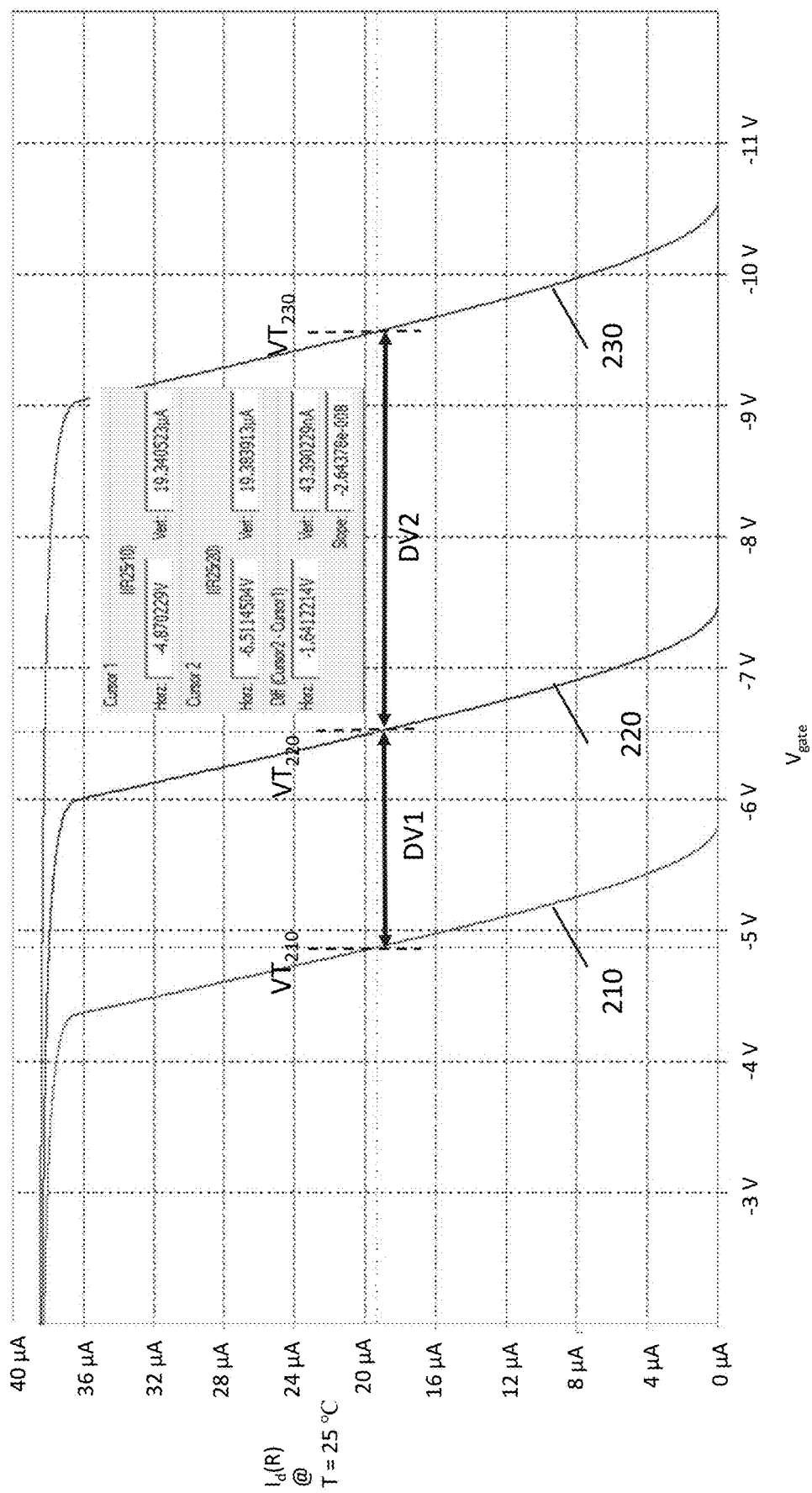

Results of simulations involving the circuits in FIGS. 2A-2D are shown in FIGS. 2E and 2F. Traces in FIG. 2E show the current ($I_d$) through the 1Ω sense resistor "R" in each drain circuit in FIGS. 2A-2D. Each trace is labeled according to radius. The y-axis of each plot indicates the temperature being tested.

As shown in FIG. 2E, as radius in each increases at a given temperature (e.g., as radius increases from 10-30 mm over 280, 290, and 295), the negative magnitude of the threshold voltage of the respective JFET increases. As temperature increases, $I_d$ at threshold voltage decreases. As temperature increases for a given radius (see traces 210-280 representing r=10 mm for temperatures 25=500° C.), the negative magnitude of the threshold voltage increases.

The data in FIG. 2E indicate that changes in threshold voltage with radius are fairly consistent regardless of temperature. This is best observed by fitting to the threshold voltage for $V_{gate}$ according to the data in FIG. 2E. The fits show that the threshold voltage (VT) changes by about 1.65 volts between r=10 mm and r=20 mm. See, for example, DV1 in FIG. 2F, which is the difference between VT for circuit 220 ("$VT_{220}$") for r=20 mm and circuit 210 ("$VT_{210}$") at r=10 mm. Table 2 summarizes DV1 for each temperature described above.

TABLE 2

DV1, the VT difference between circuits at r = 10 mm and r = 20 mm from the center of the wafer, at various temperatures.

| Temperature (° C.) | DV1 ($VT_{r=20\ mm} - VT_{r=10mm}$) (V) |
|---|---|
| 25 | 1.64 |
| 300 | 1.64 |
| 460 | 1.65 |
| 500 | 1.65 |

The data in FIG. 2E also show that the threshold voltage (VT) changes by about 3.06 volts between r=20 mm and r=30 mm. See, for example, DV2 in FIG. 2F, which is the difference between VT for circuit 220 ("$VT_{220}$") at r=20 mm and 230 ("$VT_{230}$") for r=30 mm. Table 2 summarizes DV2 for each temperature described above.

TABLE 3

DV2, the VT difference between circuits at r = 20 mm and r = 30 mm from the center of the wafer, at various temperatures.

| Temperature (° C.) | DV2 ($VT_{r=30\ mm} - VT_{r=20mm}$) (V) |
|---|---|
| 25 | 3.05 |
| 500 | 3.06 |

These results show a substantial change in VT with both distance from center of wafer (radius) and temperature. They suggest compensation for these changes in VT may allow differently located JFETs to function similarly, regardless of inhomogeneities of the wafer or epitaxial layers on the wafer. For example, the difference DV1 in VT for devices at r=10 mm and r=20 mm, regardless of temperature, of around 1.65 V (see Table 2) may be accounted for by biasing the circuit to offset DV1. Biasing might also offset the difference DV2 in VT for devices at r=20 mm and r=30 mm, which also appears to be stable with temperature. The latter is closer to 3.06 V (see Table 3).

The VT shifts DV1 and DV2 shown in the simulation results in Tables 2 and 3, which implies that a simple current source value will change over radius. In order for circuits to operate similarly regardless of location on the wafer, some form of self-regulation is needed to make these circuits behave similarly. The next sections of this disclosure concern several methods to provide this self-regulation or compensation.

Mediation Via Current Source

In this section of this disclosure, the Authors discuss using a current source to mediate the differential operating results based on radius and temperature discussed above.

Figure 3A:
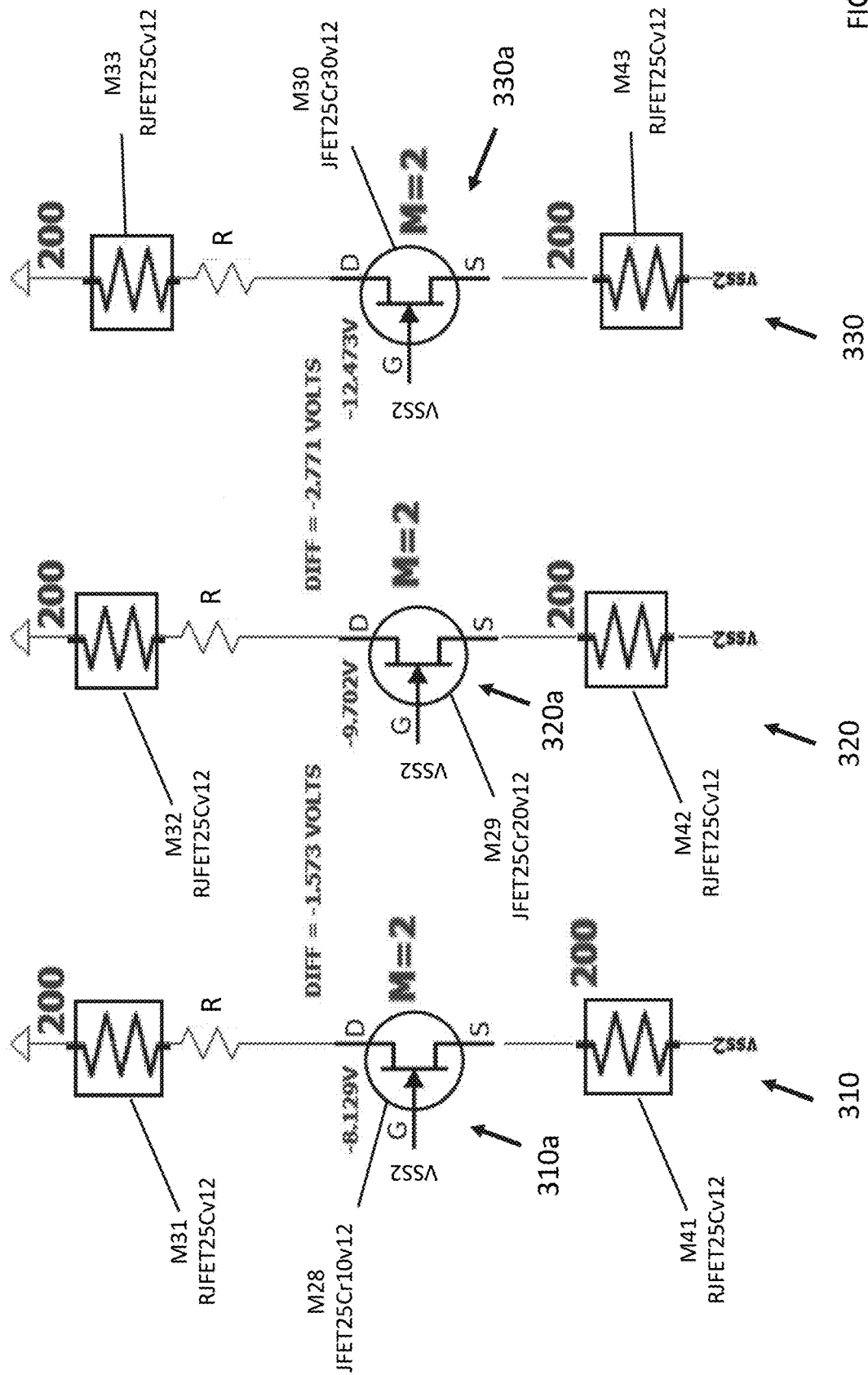
FIG. 3A shows three 25° C. current source circuits, 310, 320, and 330, with r=10, 20, and 30 mm, respectively.
Figure 3B:
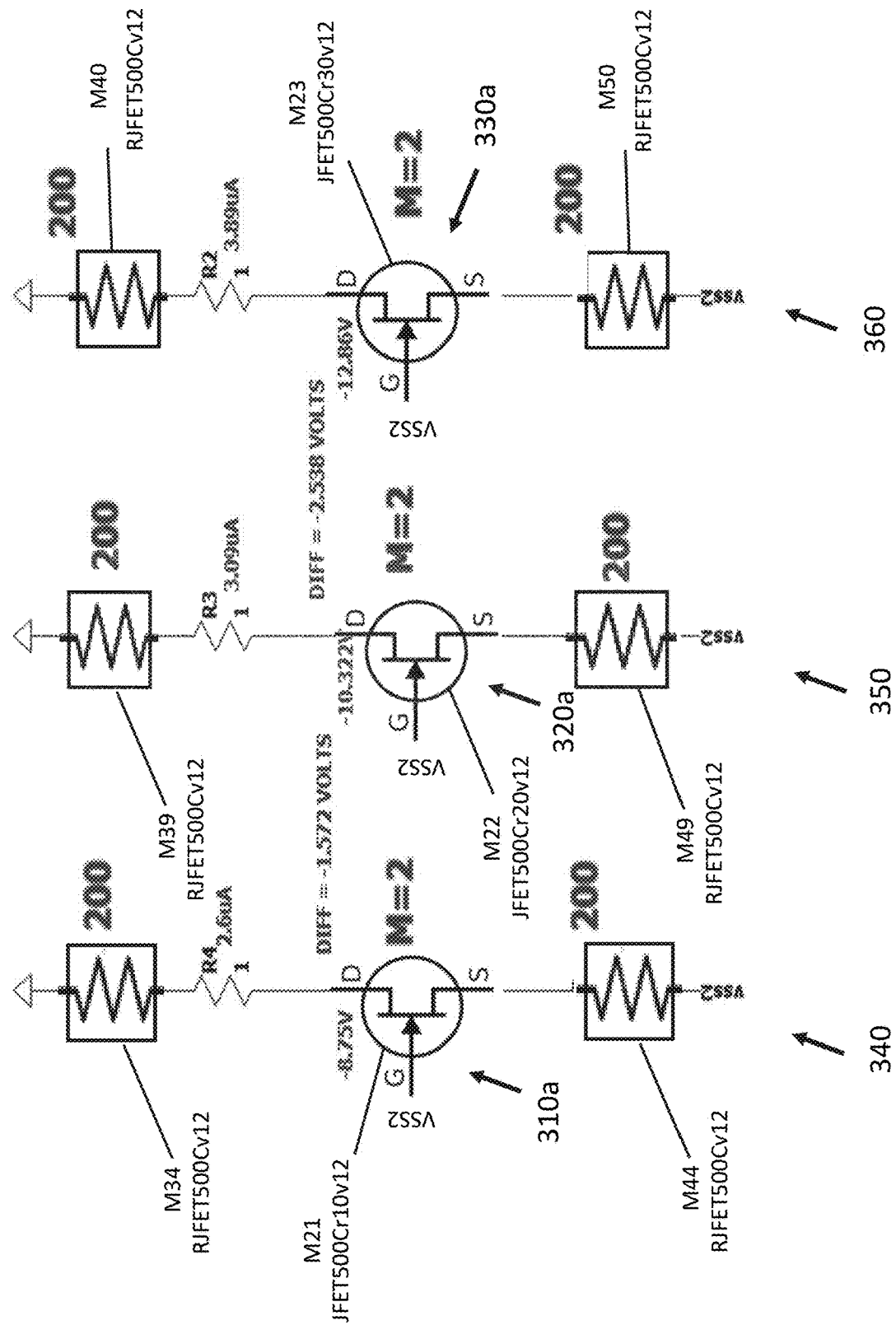
FIG. 3B shows three similar circuits, 340, 350, and 360, to the circuits in FIG. 3A for 500° C.

FIG. 3A shows three 25° C. current source circuits, 310, 320, and 330, with r=10, 20, and 30 mm, respectively. In each circuit 310-330, a self-biased current source 310a, 320a, and 330a drives a resistive drain circuit load R. FIG. 3B shows three similar circuits 340, 350, and 360 for 500° C.

The following drain voltage changes and source voltage changes (labeled as "DIFF" in FIG. 3A) are observed:

TABLE 4

DV1 and DV2 for the self-biased current source circuits in FIGS. 3A and 3B.

| Temp. (°C.) | DV1 ($VT_{r=20\ mm} - VT_{r=10\ mm}$) (V) | DV2 ($VT_{r=30\ mm} - VT_{r=20\ mm}$) (V) | Circuits |
|---|---|---|---|
| 25 | 1.573 | 2.771 | 310, 320, and 330 |
| 500 | 1.572 | 2.538 | 340, 350, and 360 |

Note that DV1 and DV2 are relatively consistent with previous results (i.e., the results shown in TABLES 2 and 3, respectively). For example DV1 in TABLE 5 is about 1.57 V, approximately equal to the 1.66 V average change in TABLE 2. Further, DV2 in TABLE 4 is 2.5-2.7 V, close also to the previously observed 3.06 V value in TABLE 3. Therefore, DV1 and DV2 are relatively consistent in both transconductance and current source configurations, suggesting that current sources may be used to offset changes in VT with radius.

However, Authors also observed that drain currents in circuits 310, 320, and 330 differ according to distance from center of the wafer. This suggests that merely offsetting bias alone may not always be sufficient for compensating for VT changes with radius.

For example, the drain current $I_d$ for in the case of the 500° C. circuits at 10 mm (i.e., circuit 340 in FIG. 3B) is 2.6 μA and 20 mm (i.e., circuit 350 in FIG. 3B) is 3.09 uA. This represents a difference in $I_d$ for circuits 340 and 350 of about 15.9%. We refer to the difference in $I_d$ between the circuits at r=20 and r=10 (e.g., circuits 350 and 340, respectively in FIG. 3B) as DI1 and the difference in $I_d$ between the circuits at r=30 and r=20 (e.g., circuits 360 and 350, respectively in FIG. 3B) as DI2. The current differences appear in Table 5.

TABLE 5

DI1 and DI2 for the self-biased current source circuits in FIGS. 3B.

| Temp. (°C.) | DI1 ($I_{d\ (r=20\ mm)} - I_{d\ (r=10\ mm)}$) (μA) | DI2 ($I_{d\ (r=30\ mm)} - I_{d\ (r=20\ mm)}$) (μA) | Circuits |
|---|---|---|---|
| 500 | 0.490 | 0.800 | 340, 350, and 360 |

Figure 3C:
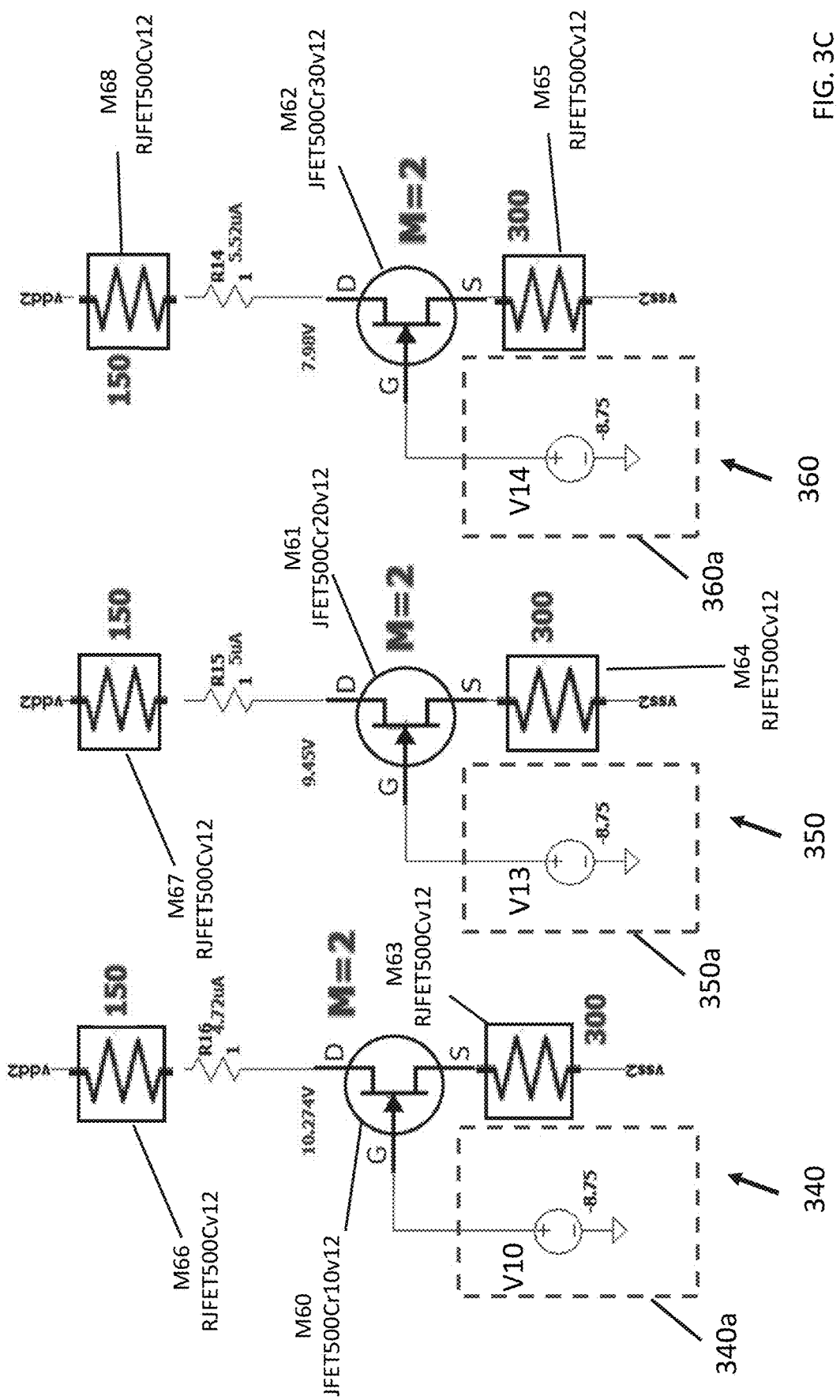
FIG. 3C illustrates an attempt to use biasing in the circuits of FIG. 3B (circuits 340, 350, and 360) to decrease the changes in $I_d$ with distance from the center of the wafer.

FIG. 3C illustrates an attempt to use biasing in the circuits of FIG. 3B (circuits 340, 350, and 360) to decrease the changes in $I_d$ with distance from the center of the wafer. More specifically, bias circuits 340a, 350a, and 360a have been added to circuits 340, 350, and 360, respectively. Each includes a voltage source with a −8.75 V bias (V10, V13, and V14, respectively), by generating around 5 μA of current. Current matching between circuits 340, 350, and 360 is improved by the addition of bias circuits 340a, 350a, and 360a. For example, the difference between the current flowing through resistor R in circuit 340 (4.72 μA) and the same current in circuit 360 (5.52 µA), a difference in radius from 10 mm to 30 mm, respectively, is now around 14.5%. The DI1 and DI2 values are given in TABLE 6.

TABLE 6

DI1 and DI2 for the self-biased current source circuits in FIGS. 3C.

| Temp. (°C.) | DI1 ($I_{d\ (r=20\ mm)}$ − $I_{d\ (r=10\ mm)}$) (µA) | DI2 ($I_{d\ (r=30\ mm)}$ − $I_{d\ (r=20\ mm)}$) (µA) | Circuits |
|---|---|---|---|
| 500 | 0.280 | 0.520 | 340, 350, and 360 |

Figure 3D:
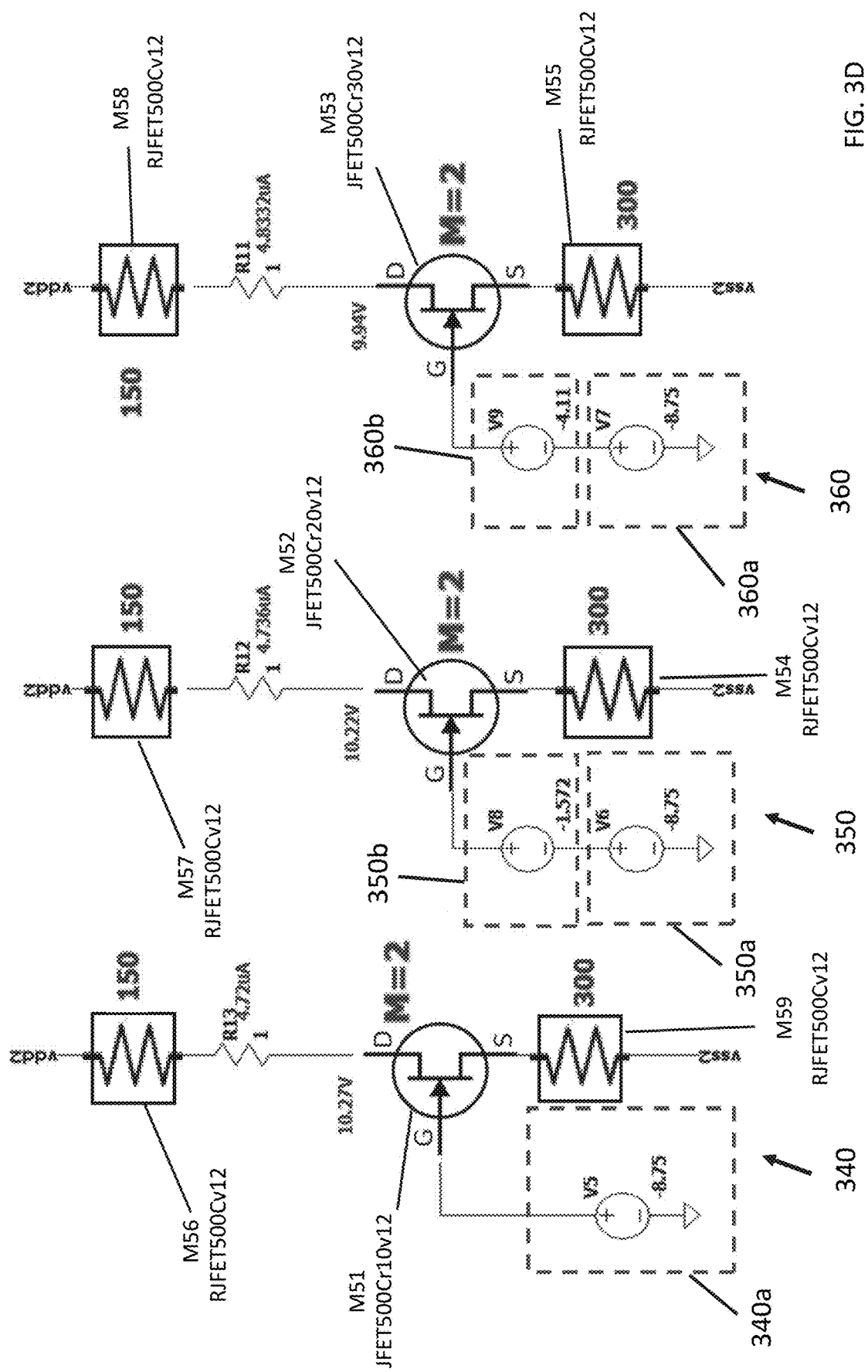
FIG. 3D illustrates the same circuits in FIG. 3C with additional biases on circuits 350 and 360 added, in part, to even out $I_d$.

FIG. 3D illustrates the same circuits in FIG. 3C with additional biases on circuits 350 and 360 added, in part, to even out $I_d$. Biases 350b (V8) and 360b (V9) augment the gate voltage set point of the JFETs M52 and M53, respectively. 350b augments the gate voltage of M52 by 1.572 V and 360b augments the gate voltage of M53 by 4.11 V.

Authors observed the additional biasing provided by 350b and 360b improved current matching across radius. More specifically, the 360b bias decreases $I_d$ flowing through R in circuit 360 to 4.833 µA (from 5.52 µA in the configuration shown in FIG. 3C). Since $I_d$ in circuit 340 remains the same at 4.72 µA, this means that the difference between $I_d$ in circuits 240 and 260, associated with an increase in r from 10 mm to 30 mm, is now down to 2.34%, as opposed to 14.5% for the configuration in FIG. 3C. Similarly, the difference between $I_d$ in circuit 340 (4.72 µA) and 350 (4.736 µA) (i.e., between r=10 mm and 20 mm) is now 0.34%. The DI1 and DI2 values are given in Table 7.

TABLE 7

DI1 and DI2 for the self-biased current source circuits in FIGS. 3D.

| Temp. (°C.) | DI1 ($I_{d\ (r=20\ mm)}$ − $I_{d\ (r=10\ mm)}$) (µA) | DI2 ($I_{d\ (r=30\ mm)}$ − $I_{d\ (r=20\ mm)}$) (µA) | Circuits |
|---|---|---|---|
| 500 | 0.016 | 0.0972 | 340, 350, and 360 |

Figure 3E:
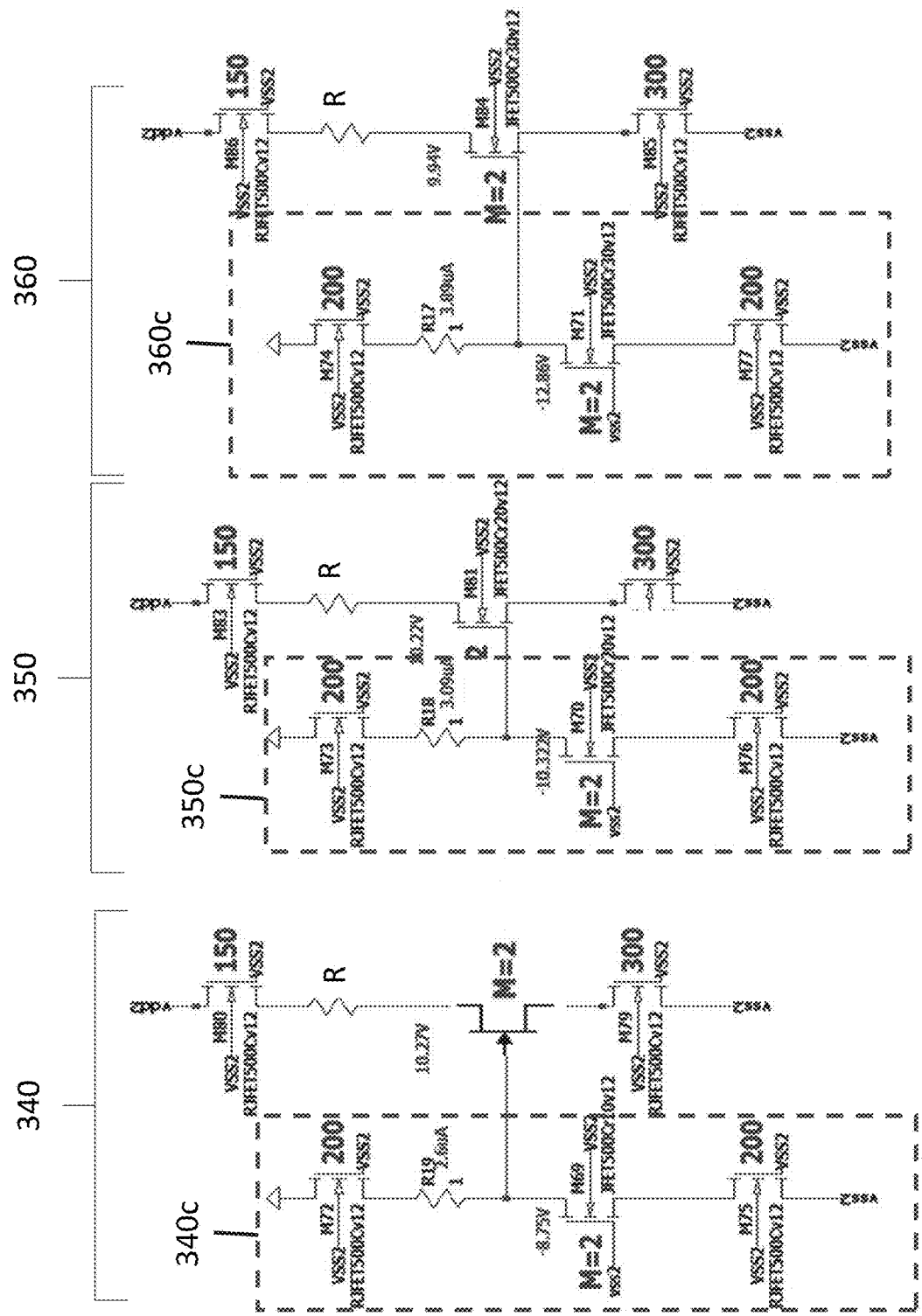
FIG. 3E illustrates another realization in which the voltage sources 340a-360a and 350b and 360b are replaced by circuits 340c, 250c, and 360c.
Figure 3F:
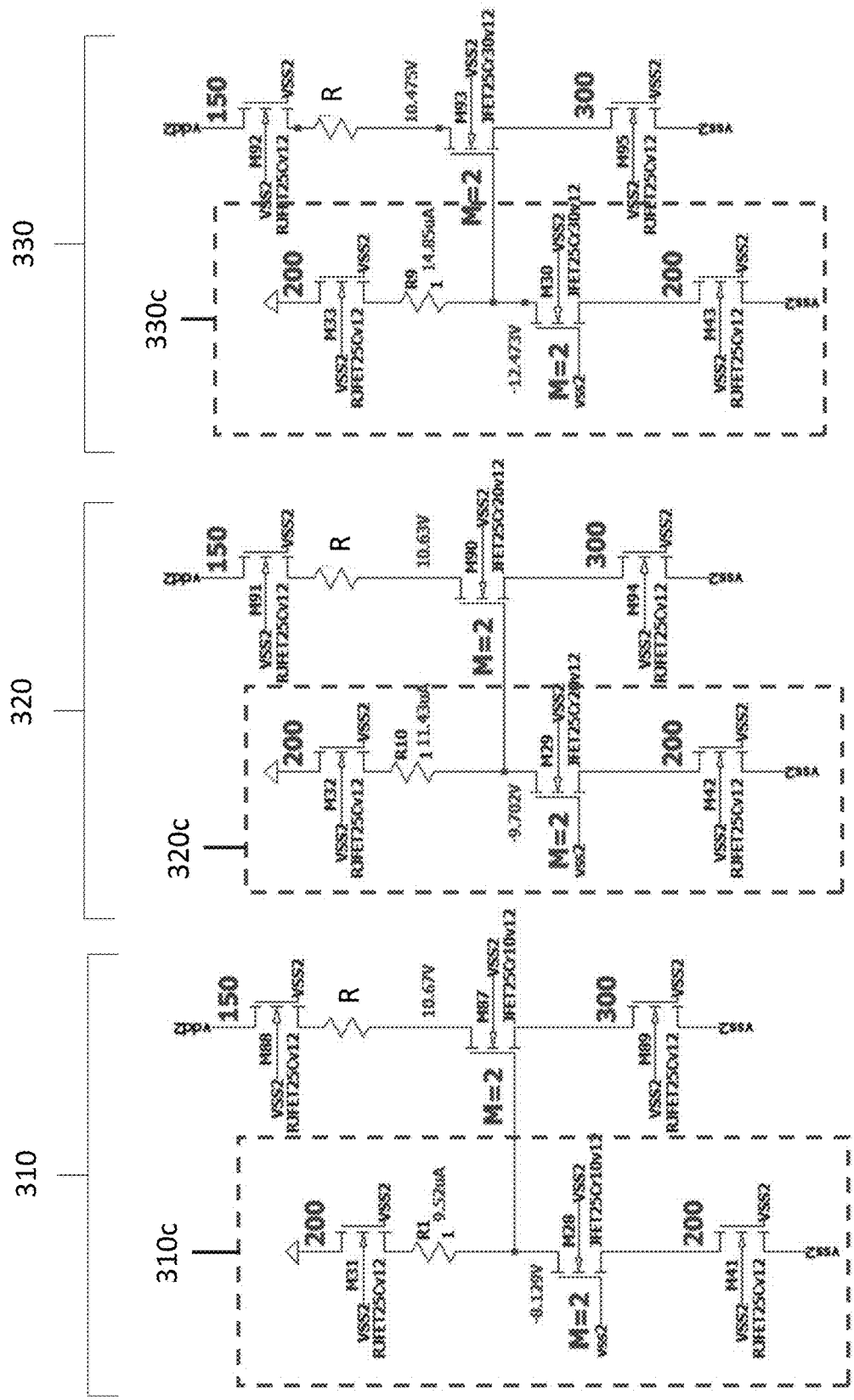
FIG. 3F illustrates the drain voltage bias positioning of FIG. 3E applied to the 25° C. case.

FIG. 3E illustrates[2] another realization in which the voltage sources 340a-360a and 350b and 360b are replaced by circuits 340c, 250c, and 360c. Circuits 340c, 250c, and 360c are the same current source circuits as those shown in FIG. 3B. The circuit in FIG. 3E leads to a similar lowering of differences in $I_d$ across R in 340, 350, and 360 as the circuits in FIG. 3D. Specifically, the currents appear below in TABLE 8.

[2] As discussed above, from FIG. 3E onward, both JFETs and RJFETs will be represented in the figures using LTspice program symbols for an n-channel MOSFET. The n-channel MOSFET symbol is merely meant to reflect how the model is parameterized. It is to be understood that these components are JFETs and RJFETs, not MOSFETs.

TABLE 8

DI1 and DI2 for the self-biased current source circuits in FIGS. 3E.

| Temp. (°C.) | DI1 ($I_{d\ (r=20\ mm)}$ − $I_{d\ (r=10\ mm)}$) (µA) | DI2 ($I_{d\ (r=30\ mm)}$ − $I_{d\ (r=20\ mm)}$) (µA) | Circuits |
|---|---|---|---|
| 500 | 0.016 | 0.0961 | 340, 350, and 360 |

FIG. 3F illustrates the drain voltage bias positioning of FIG. 3E applied to the 25° C. case (i.e., the circuits in FIG. 3A). These results indicate that the technique is robust for maintaining both VT and $I_d$ over different temperatures. See Tables 9 and 10 below, which also show results for 300° C. and 400° C.

TABLE 9

DV1 and DV2 for the self-biased current source circuits.

| Temp. (°C.) | DV1 ($VT_{r=20\ mm}$ − $VT_{r=10\ mm}$) (V) | DV2 ($VT_{r=30\ mm}$ − $VT_{r=20\ mm}$) (V) | Circuits |
|---|---|---|---|
| 25 | −0.050 | −0.28 | 310, 320, and 330 |
| 300 | −0.048 | — | 240 and 250 |
| 400 | −0.050 | — | 260 and 270 |

TABLE 10

DI1 and DI2 for the self-biased current source circuits.

| Temp. (°C.) | DI1 ($I_{d\ (r=20\ mm)}$ − $I_{d\ (r=10\ mm)}$) (µA) | DI2 ($I_{d\ (r=30\ mm)}$ − $I_{d\ (r=20\ mm)}$) (µA) | Circuits |
|---|---|---|---|
| 25 | 0.016 | 0.0961 | 310, 320, and 330 |
| 300 | 0.028 | — | 240 and 250 |
| 400 | 0.019 | — | 260 and 270 |

Impact of Body Effect

Other devices may offer more gain than the circuits discussed above. These include, for example, devices with a common source amplifier. A common source amplifier used to derive the gate bias voltage for the current source should have a gain of unity. However, such other devices may be subject to inhomogeneities in performance with temperature and radius due to variations in the wafer as well as other variations. In addition, such devices may also be subject to the body effect, which impacts both device (e.g., transistor, resistor) and circuit (e.g., gain, bandwidth, etc.) parameters. This section explores methods for addressing the body effect on such devices.

Generally, the body effect refers to the change in the transistor electrical performance properties (including VT) resulting from a voltage difference between the transistor source and body. Often, as is the case for the SiC JFET ICs we have fabricated, the transistor body terminal is physically the semiconductor wafer. Ref. [P1] describes the body effect for the SiC JFETs we have fabricated and used to construct SiC ICs. Various devices integrated onto a common semiconductor wafer substrate will have differing source-to-body biases in functional integrated circuits. The body effect can also implicate more devices other than just transistors, as described in Ref [P2]. Because the voltage difference between the source and body affects the VT, the body can be thought of as a second gate that helps determine how the transistor turns on and off. As shown in Ref. [P1], the relationship between JFET threshold voltage VT and zero-body-bias FET threshold voltage VTO is closely approximated by the following equation:

$$VT = VTO + GAMMA(\sqrt{2 \cdot PHIB - V_S} - \sqrt{2 \cdot PHIB}) \quad \text{(Equation 2)}$$

Wherein GAMMA is the body effect coefficient, PHIB is the built-in potential of the source-to-substrate pn junction, and VS is the source-to-body bias of the device. The calculation of GAMMA and PHIB from physical/structural SiC JFET parameters (e.g., device dimensions and doping) is detailed in Ref. [P1].

The body bias can be supplied from an external (off-chip) source or an internal (on-chip) source. The SiC JFET and resistor ("RFJET") models described in Refs [P1] and [P2] account for the body effect.

Figure 4:
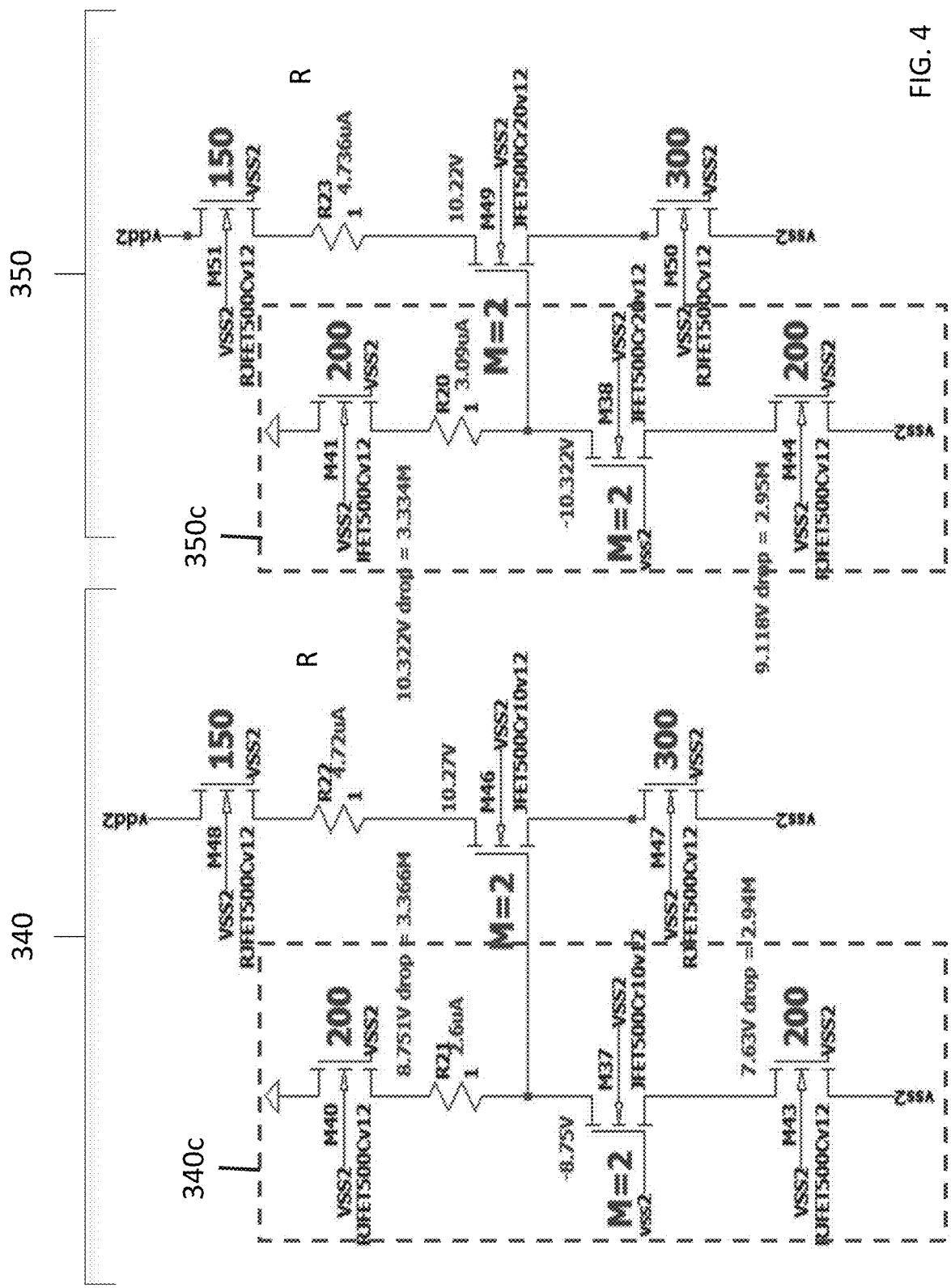
FIG. 4 illustrates the body effect for a temperature of 500° C. and r=10 and r=20 mm on the circuits 340 and 350 in FIG. 3E.

FIG. 4 illustrates the body effect for a temperature of 500° C. and r=10 and r=20 mm on the circuits 340 and 350 in FIG. 3E.

With regard to circuit 340 (r=10 mm), measurements reveal that the drain resistor for 340c [RJFET500v12 (M40)], has an effective value of about $V_{drain}/I=8.751$ V/2.6 μA=3.36 MΩ. The source resistor for 340c [RJFET500v12 (M43)], has a value of about $V_{source}/I=7.63$ V/2.6 μA=2.93MΩ. This yields a gain, or difference in effective resistance, of $V_{source}/I_{drain}=0.872$. Yet both resistors should be the same—both have a value of 200 squares and are parameterized for the same temperature (i.e., 500° C.). The difference in effective resistance is likely accounted for by the body effect.

With regard to circuit 350 (r=20 mm), the corresponding measurements [for circuit 350c, drain resistor RJFET500v12 (M41) and source resistor RJFET500v12 (M44)] reveal a gain of $V_{source}/V_{drain}=9.118$ V/10.322 V=0.883. Again, both resistors should be the same. Both have a nominal value of 200 squares and are parametrized for the same temperature (i.e., 500° C.). Again the difference is likely due to the body effect on both resistors.

These results appear in Table 11 below. They show, collectively, that gain differs at 500° C. for r=10 and r=20 mm due to the body effect.

TABLE 11

Gain for the self-biased current source circuits 340c and 350c at 500° C. in FIG. 4.

| r (mm) | Circuit | Drain resistor | Drain resistor Value (Squares) | Source resistor | Source resistor Value (Squares) | Gain ($V_{source}/V_{drain}$) |
|---|---|---|---|---|---|---|
| 10 | 340c | M40 | 200 | M43 | 200 | 0.872 |
| 20 | 350c | M41 | 200 | M44 | 200 | 0.883 |

Note that this results in a substantial difference between the quiescent operating points at the drain resistor [R231 (circuit 350) and R221 (circuit 340), respectively] of:

Difference in Drain Resistor Operating Points=(10.27 V−10.22 V)/10.27 V=0.49%

Such a difference would likely cause the outputs of circuits 350 and 340 to diverge in potentially unexpected ways.

Figure 5:
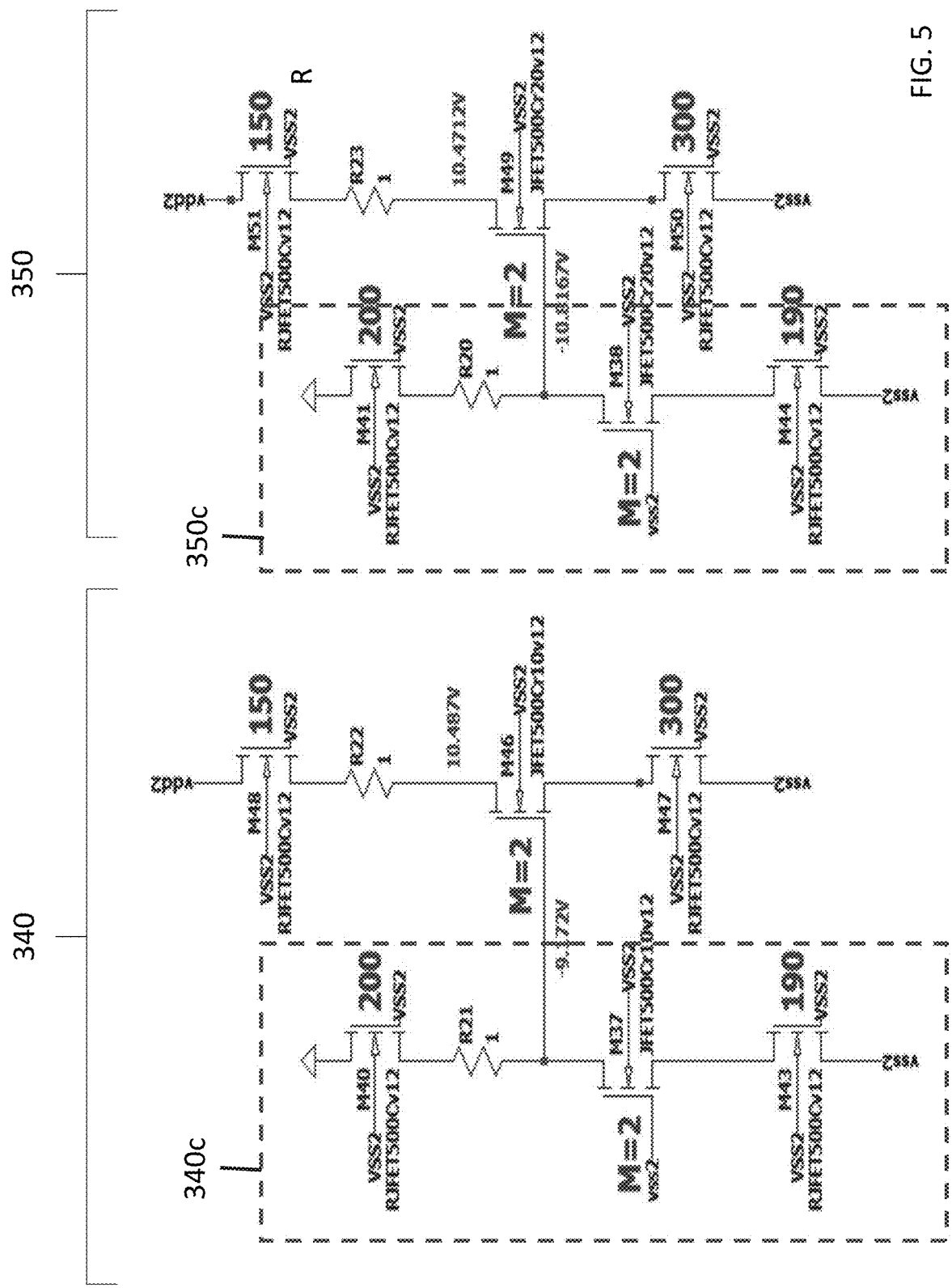
FIG. 5 presents a solution addressing the observed body effect and its resulting radius dependence on resistor gain.
Figure 6:
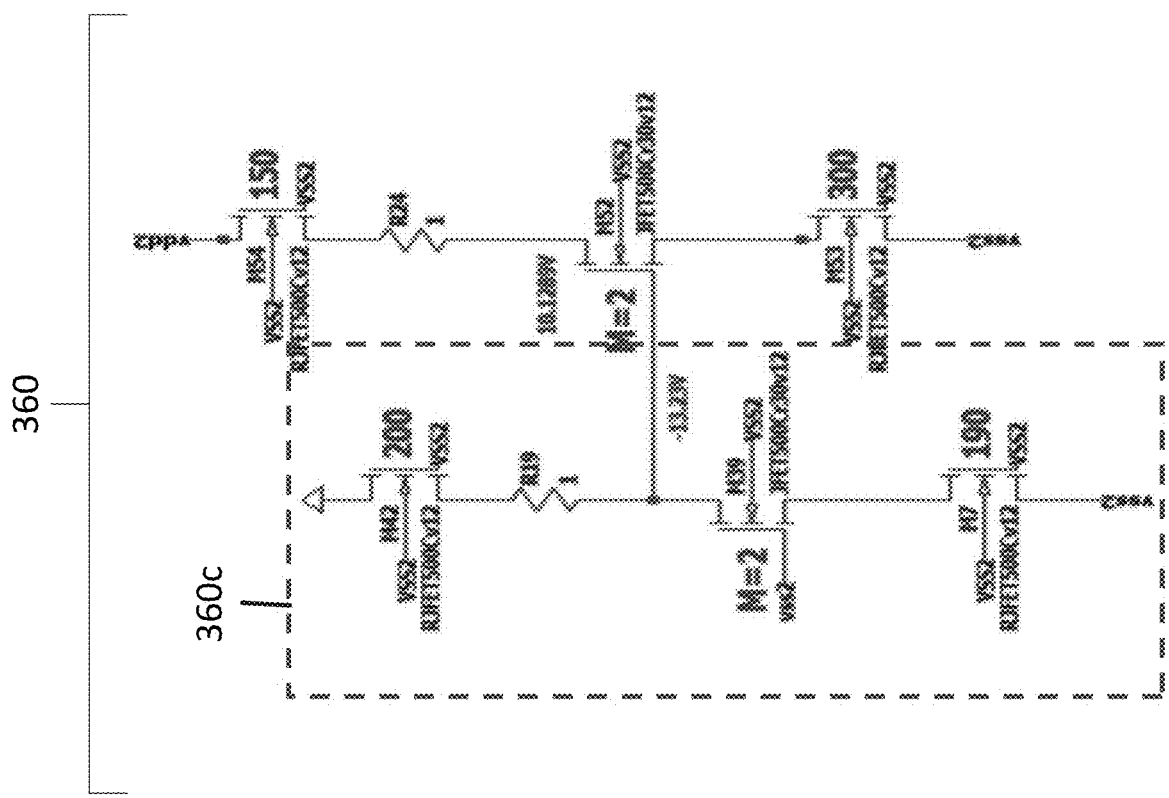
FIG. 6 shows the decreased source resistor solution applied to the r=30 mm case in which T=500° C.

FIG. 5 presents a solution addressing the observed body effect and its resulting radius dependence on resistor gain. Specifically, the circuits 340 and 350 in FIG. 5 trim the resistance values of the source resistors RJFET500v12 (M43) and RJFET500v12 (M44) to bring them into agreement with RJFET500v12 (M40) and RJFET500v12 (M41), in spite of the body effect. As shown in FIGS. 5, M43 and M44 have been trimmed from 200 to 190 squares, or from a resistance of ~5.139 M1 to a resistance of ~4.8999 M1. FIG. 5 shows that this resistor trimming results in a substantially lower difference between the quiescent operating points at the drain resistor (R231 and R221, respectively):

Difference in Drain Resistor Operating Points=10.487 V−10.4712 V)/10.487 V=0.15%.

In other words, the operating point differences have been lowered from 0.49 to 0.15, or by around ⅓. This three-fold increase in performance results from reducing the resistor values most susceptible to the body effect. Although not shown, trimming the resistors M43 and M44 also results in an increased $I_d$ because of the decrease in overall resistance. Since the increase in $I_d$ occurs for both circuits 340 and 350, this may be a desirable result.

Note that similar results (i.e., similar decrease in the difference between quiescent operating points at drain resistors R231 and R221) could also be accomplished by increasing the size (squares) of the drain resistors M40 and M41, rather than decreasing source resistors M43 and M44. This is because doing so would similarly decrease the fractional contribution of the source resistors M43 and M44, the resistors most susceptible to the body effect. The latter technique, increasing drain resistors M40 and M41, would not result in an increase in $I_d$. It may actually decrease $I_d$, which may be advantageous under certain conditions.

FIG. 6 shows the decreased source resistor solution applied to the r=30 mm case in which T=500° C. More specifically, source resistor M7 in FIG. 6 has been lowered from 200 to 190 squares. As shown in FIG. 6, this results in a quiescent operating point at the drain resistor (R421) of 10.1289 V. This represents a significant change in operating point from the r=20 mm case (10.4712 V, FIG. 5, R231). It represents a change in gate bias voltage for current source in the r=30 mm and r=20 mm cases (i.e., a difference in gate bias on M52 in FIG. 6 and M49 in FIG. 5=13.23 V−10.8167 V=2.4 V). A comparison of this value with DV2 ($VT_{r=30 mm}-VT_{r=20mm}$) in Table 3 (i.e., the difference in gate threshold voltage for r=20 and 30 mm at 500° C.) shows that it is lower by around 20%. In other words, the additional components in FIG. 6 do not completely make up for the effect of radius on device performance.

Figure 7A:
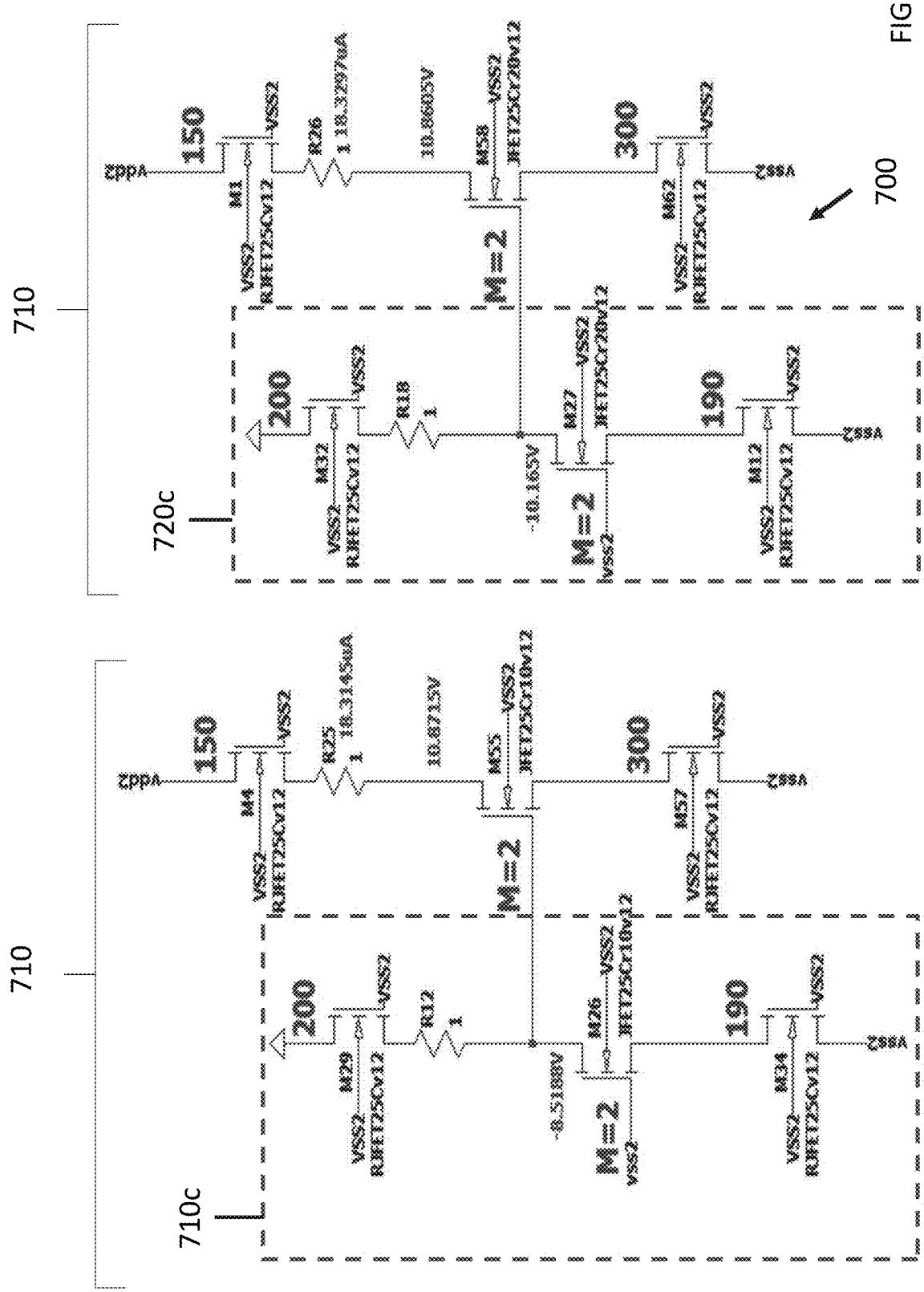
FIGS. 7A, 7B, and 8 show applying the source resistor trimming effect to temperature configurations for r=10 mm and r=20 mm at 25° C., 300° C., and 460° C., respectively.
Figure 7B:
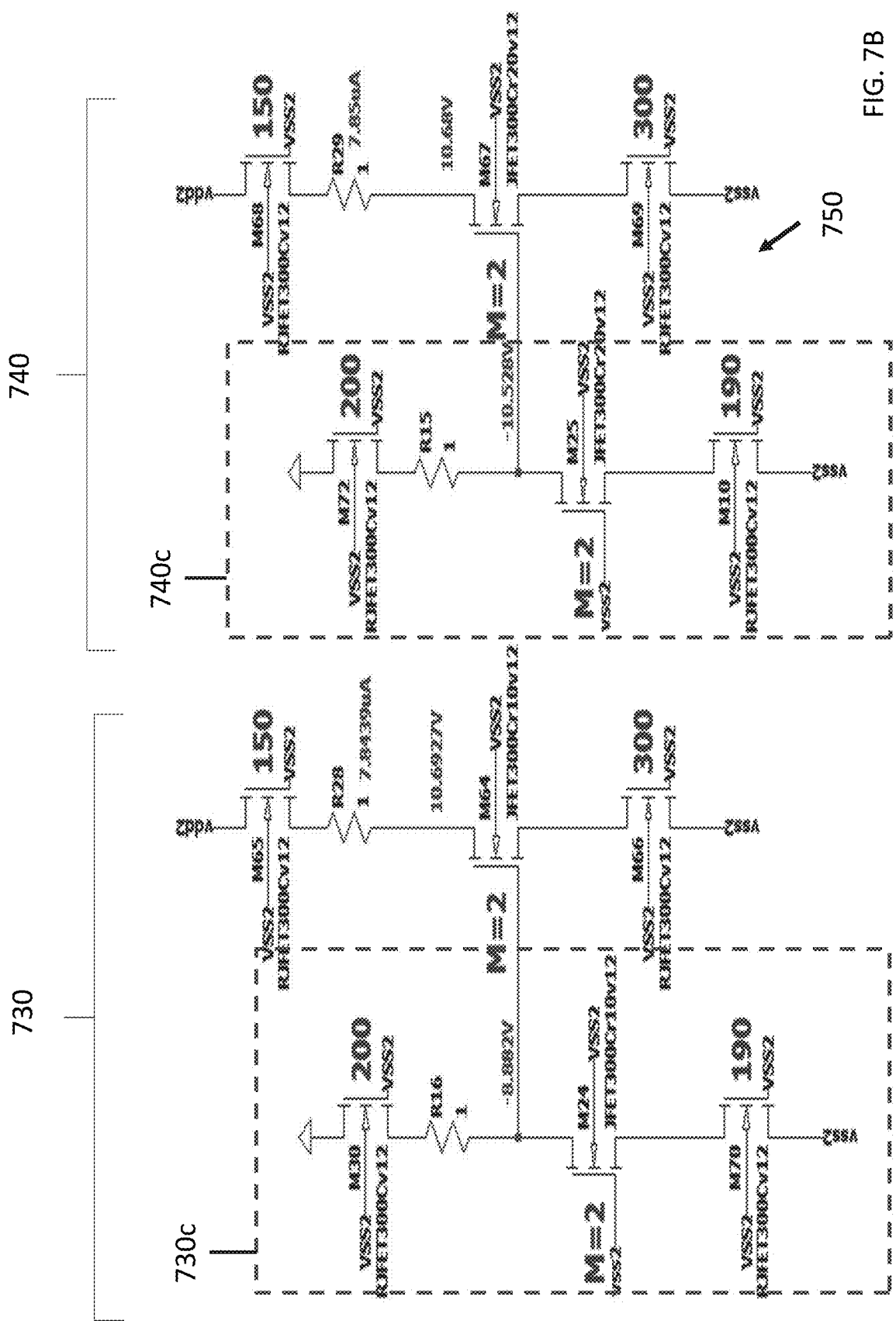
Figure 8:
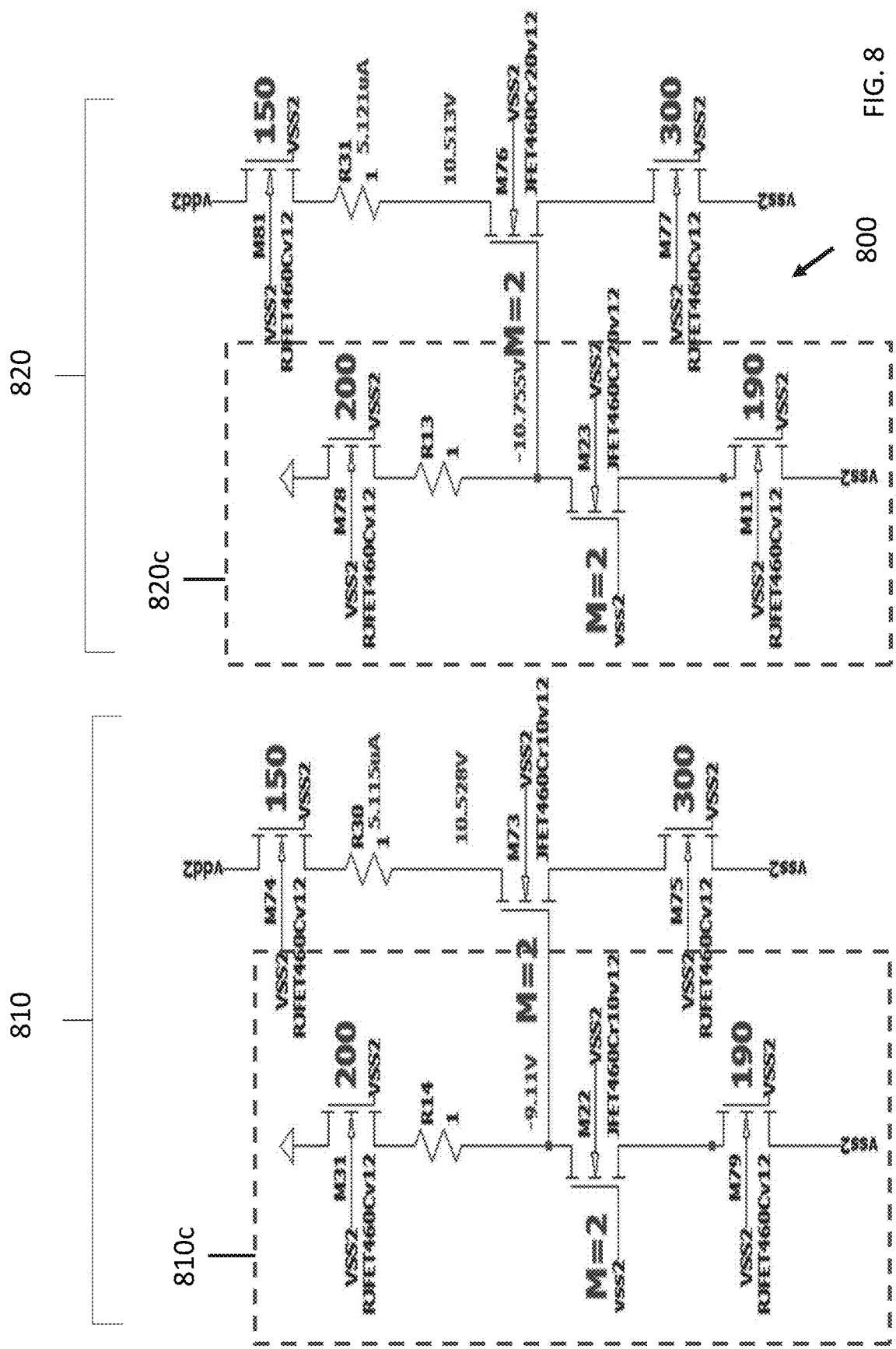

FIGS. 7A, 7B, and 8 show applying the source resistor trimming effect to temperature configurations for r=10 mm and r=20 mm at 25° C., 300° C., and 460° C., respectively. Table 12 summarizes the results.

TABLE 12

Gain for the self-biased current source circuits 340c and 350c at 500° C. in FIG. 4.

| Temp. (° C.) | Circuits | Drain Resistors in Current Source | Difference in Quiescent Operating Points at Drain Resistor (%) |
|---|---|---|---|
| 25 | 710 and 720 | R25 and R26 | 0.10 |
| 300 | 730 and 750 | R28 and R29 | 0.12 |
| 460 | 810 and 820 | R30 and R31 | 0.14 |

The results show a decrease of around ⅓ in difference in drain resistor operating points compared to the case shown in FIG. 4 without resistance trimming (i.e., 0.49%). Therefore, the results show that the resistor technique is effective at decreasing the body effect at these temperatures as well.

Application of Design Principles to Amplifiers

In a common source configuration, the gain of a JFET amplifier can be expressed as:

$$\text{JFET Gain}=-(gm)R_d \quad \text{(Equation 3)}$$

Where: gm=the JFET conductance and $R_d$=the resistance of the drain resistor. In the circuits discussed so far in this disclosure, a maximum of 300 squares resistance has been used. The maximum resistor topography is M=96. However, it is to be understood that these methods and principles apply to any suitable resistance or topography values.

Figure 9:
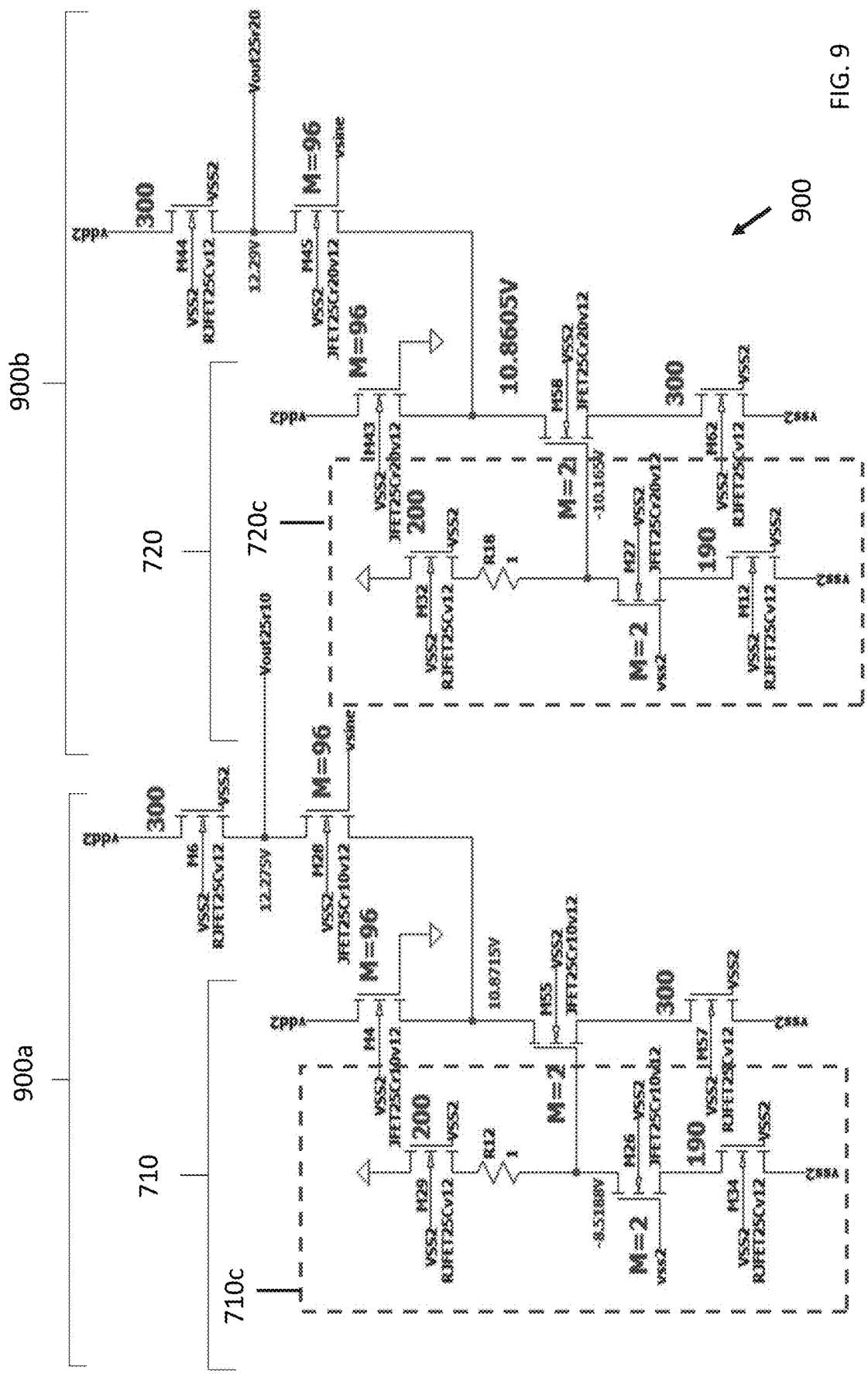
FIG. 9 shows application of the compensation principles of the present disclosure to a single output differential amplifier using the current sources and bias scheme of FIG. 7 for T=25° C. The amplifier 900 is shown in FIG. 9.

As an example, authors applied the above principles to a single output differential amplifier using the current sources and bias scheme of FIG. 7A for T=25° C. The amplifier 900 is shown in FIG. 9. As can be seen in FIG. 9, the amplifier 900 has a portion 900a corresponding to r=10 mm and another portion 900b corresponding to r=20 mm. Portion 900a encompasses circuits 710 and 710c from FIG. 7. Portion 900b encompasses circuits 720 and 720c from FIG. 7. In other words, the single output differential amplifiers 900a and 900b utilize the current sources and the bias scheme of the circuits in FIG. 7.

Amplifier 900 was tested with a 1 mV peak-to-peak sine wave as input (vsine). This input is shown as "vsine" in FIG. 10A. The output of amplifier 900a is labeled "vout25r10." The output of amplifier 900b is labeled "vout25r20."

Figure 10A:
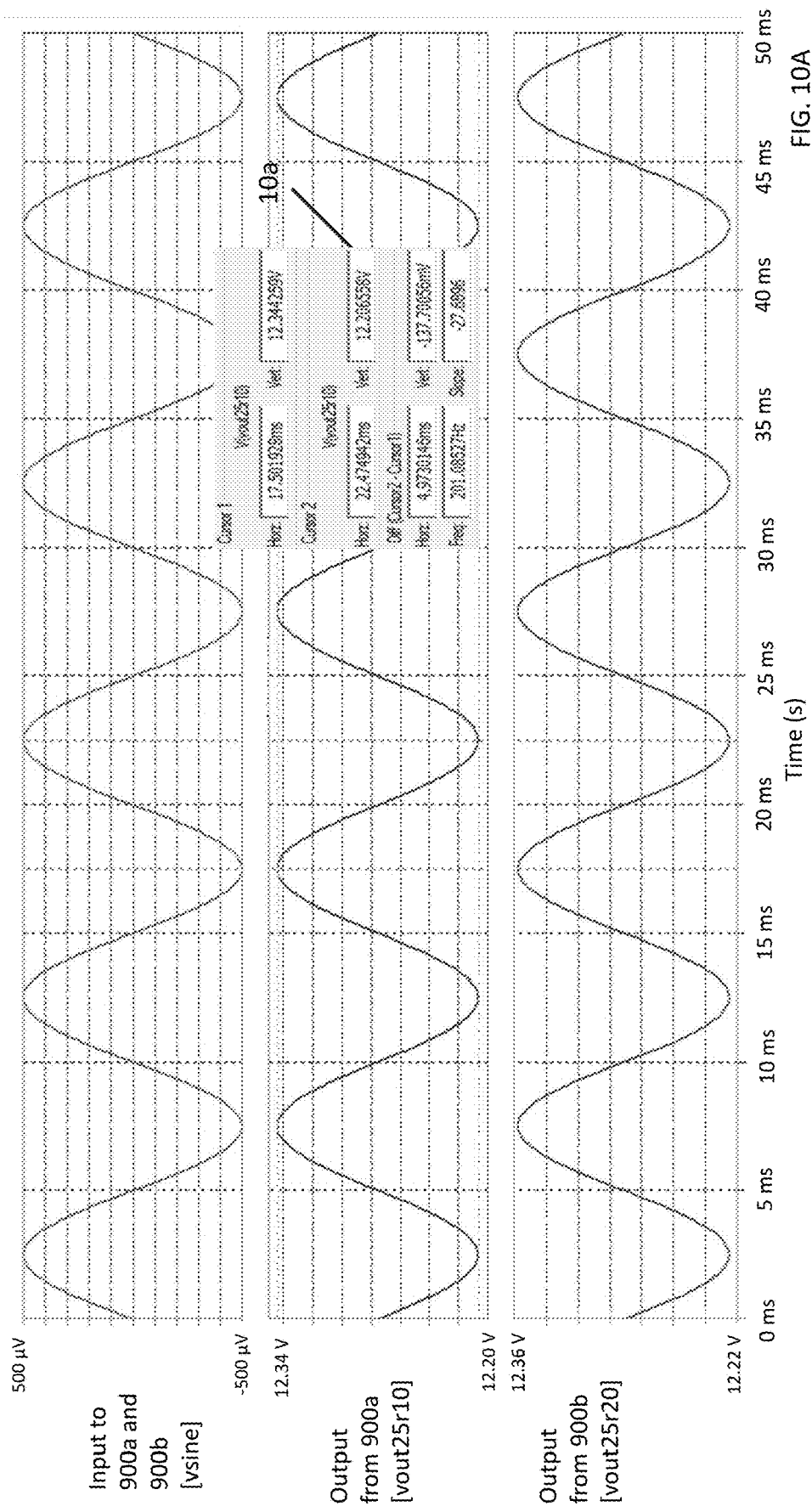
FIGS. 10A and 10B show the inputs and outputs to amplifier 900 in FIG. 9.
Figure 10B:
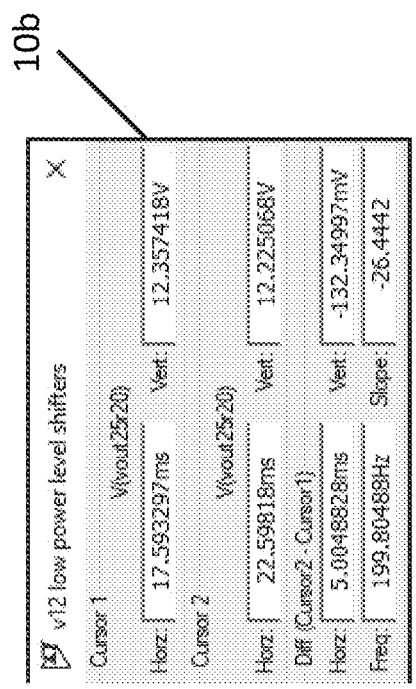

Inset 10a in FIG. 10A shows a calculation of gain for circuit 900a (r=10 mm) based on vout25r10. More specifically, the gain is the vertical difference between cursor positions at a bias of 12.275 V, divided by vsine, or ~137.7 V/V. Inset 10b in FIG. 10B shows the similarly calculated the gain of the r=20 mm circuit (900b). That gain is ~132.35 V/V, biased at approximately 12.29 V. In other words, the difference in operation of circuits 310 and 320 (r=10 vs. 20 mm) is rather small. Therefore, amplifiers 900a and 900b will function similarly thanks to compensation provided by circuits 310c and 320c, despite their differing locations from the center of the wafer (i.e., radius).

Figure 12:
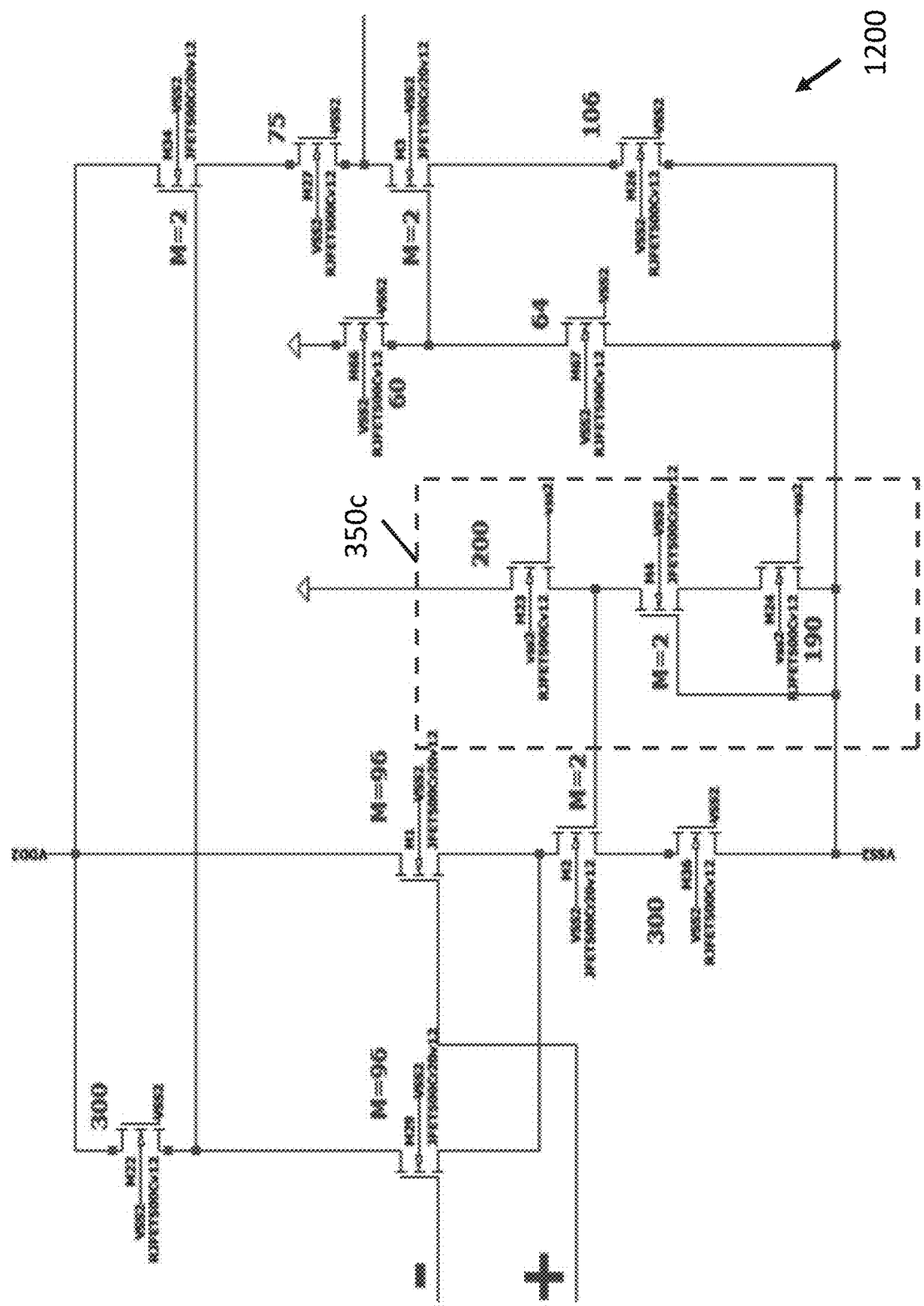
FIG. 12 shows an open loop amplifier 1200 at T=500° C. and r=20 mm, incorporating the circuit 350c from FIG. 5.
Figure 13:
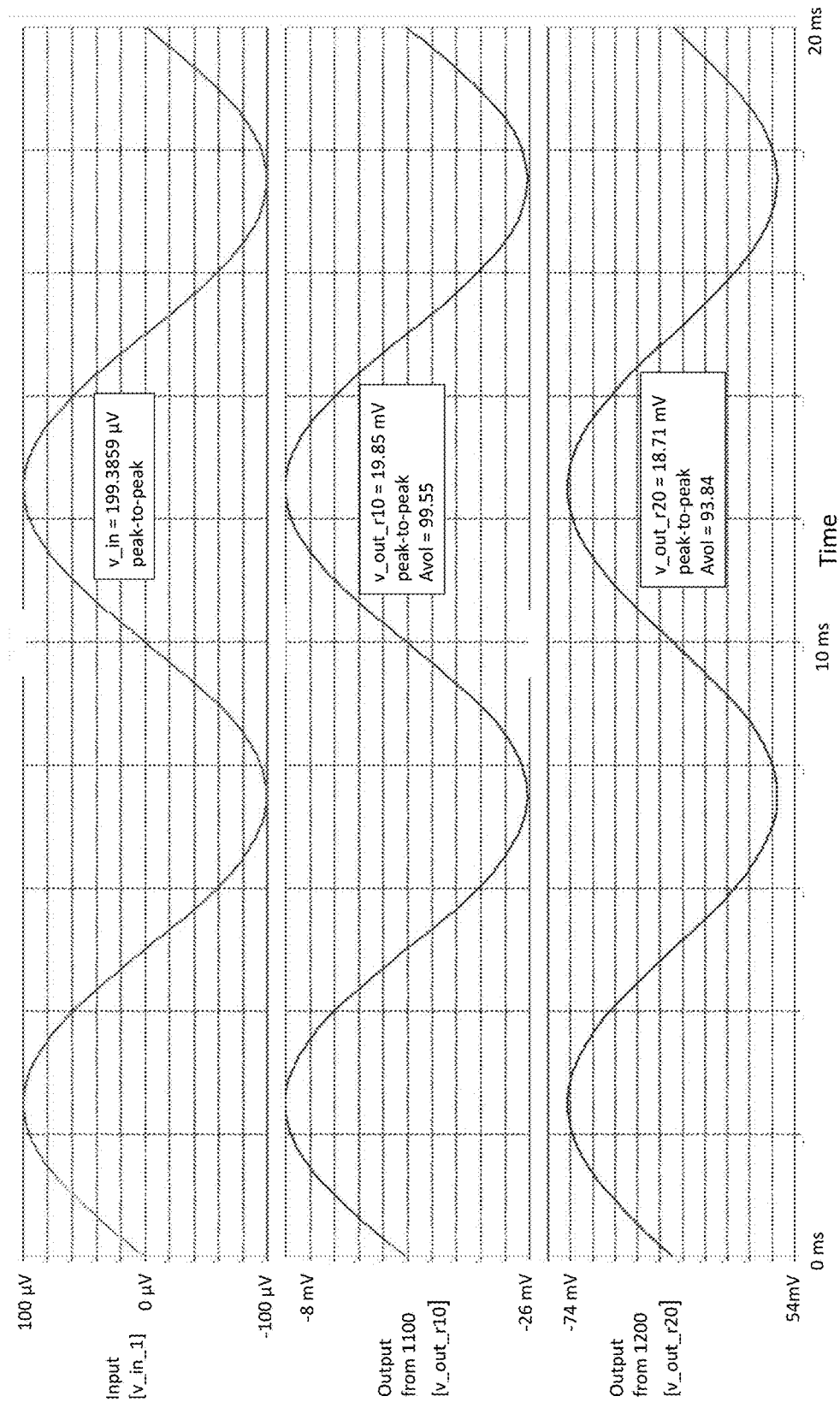
FIGS. 13-15 show the outputs of amplifiers 1100 and 1200 v_out_r10, and v_out_r20 respectively with different sine wave inputs.
Figure 14:
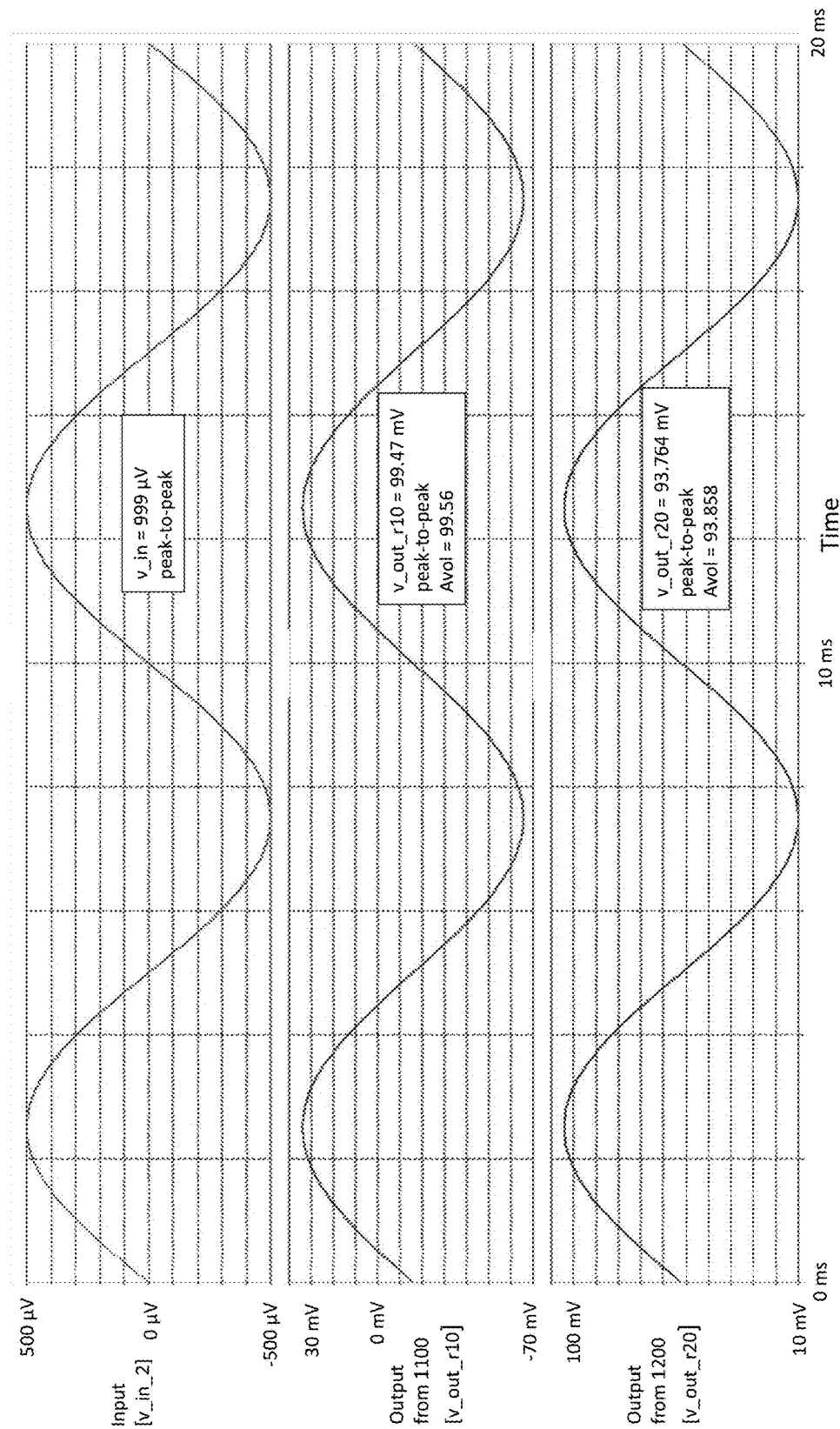
Figure 15:
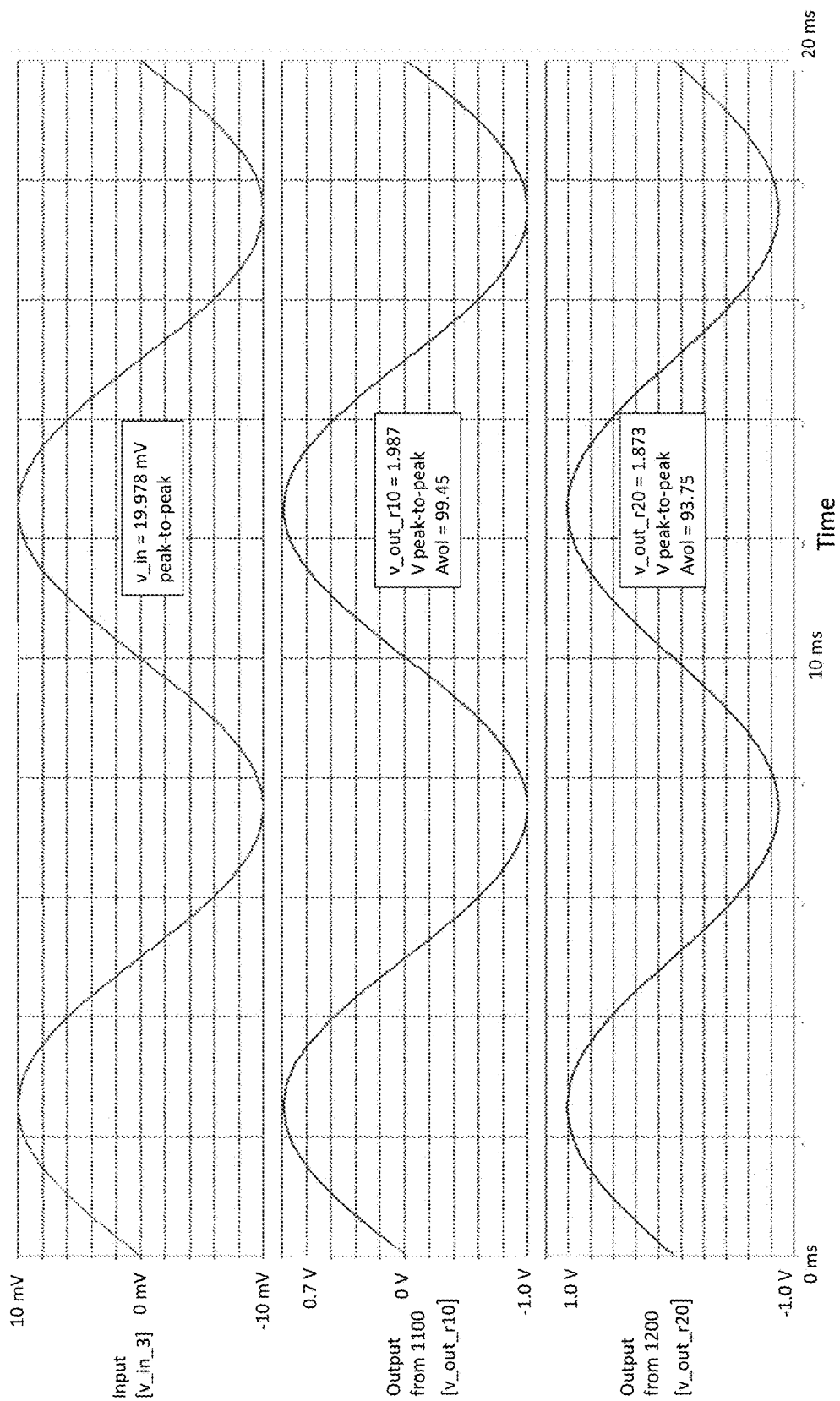

FIG. 11 shows application of similar current source biasing to an operational amplifier 1100 at T=500° C. and r=10 mm, incorporating the circuit 340c from FIG. 5. FIG. 12 shows the same amplifier 1200 at T=500° C. and r=20 mm, incorporating the circuit 350c from FIG. 5. Both amplifiers 1100 and 1200 have an open loop gain configuration. The inverting inputs to each amplifier ("−") are tied to ground. The non-inverting inputs ("+") are each driven by a sine wave ("v_in"). In the test, three different sine waves v_in_1, v_in_2, and v_in_3, are input, shown in FIGS. 13, 14, and 15, respectively. v_in_1 has a peak-to-peak amplitude of 200 μV, v_in_2 has a peak-to-peak amplitude of 1 mF, and v_in_3 has a peak-to-peak amplitude of 20 mV. Each of FIGS. 13, 14, and 15 calculates the amplifier gain "Avol" equal to $V_{output}/V_{input}$. The results are summarized in Table 13 below.

TABLE 13

Gain (Avol) for amplifiers 1100 and 1200 based on three different input signals.

| Input signal | Avol for amplifier 1100 (r = 10 mm) | Avol for amplifier 1200 (r = 20 mm) | % diff in Avol |
| --- | --- | --- | --- |
| v_in_1 | 99.55 | 93.84 | 5.7 |
| v_in_2 | 99.56 | 93.85 | 5.7 |
| v_in_1 | 99.45 | 93.75 | 5.7 |

Therefore, these results illustrate that the gain between amplifiers 1100 and 1200, at r=10 mm and 20 mm, respectively, differs by less than 6%.

Figure 16:
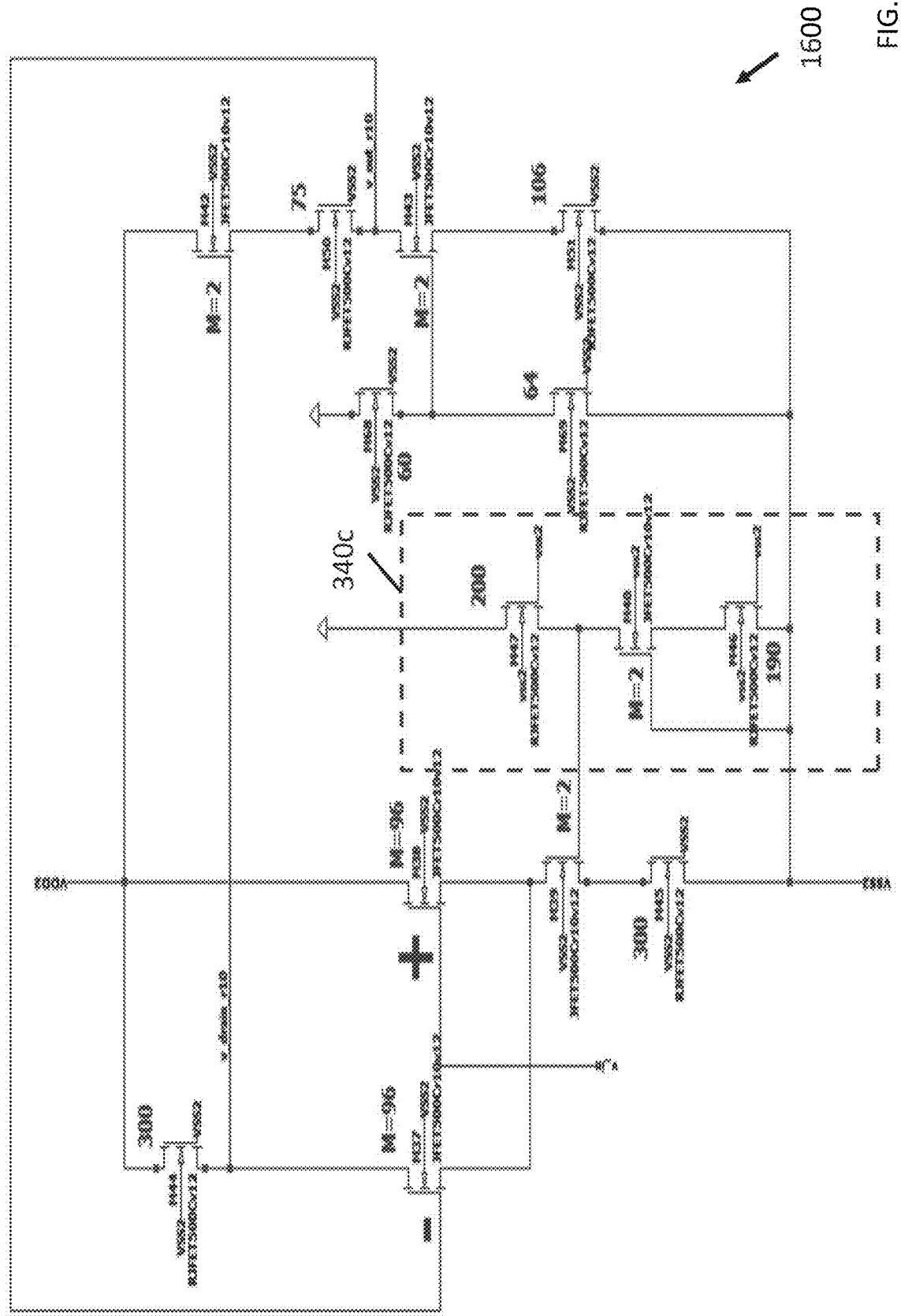
FIG. 16 shows a closed loop operational amplifier 1600 at T=500° C. and r=10 mm, incorporating the circuit 340c from FIG. 5.
Figure 17:
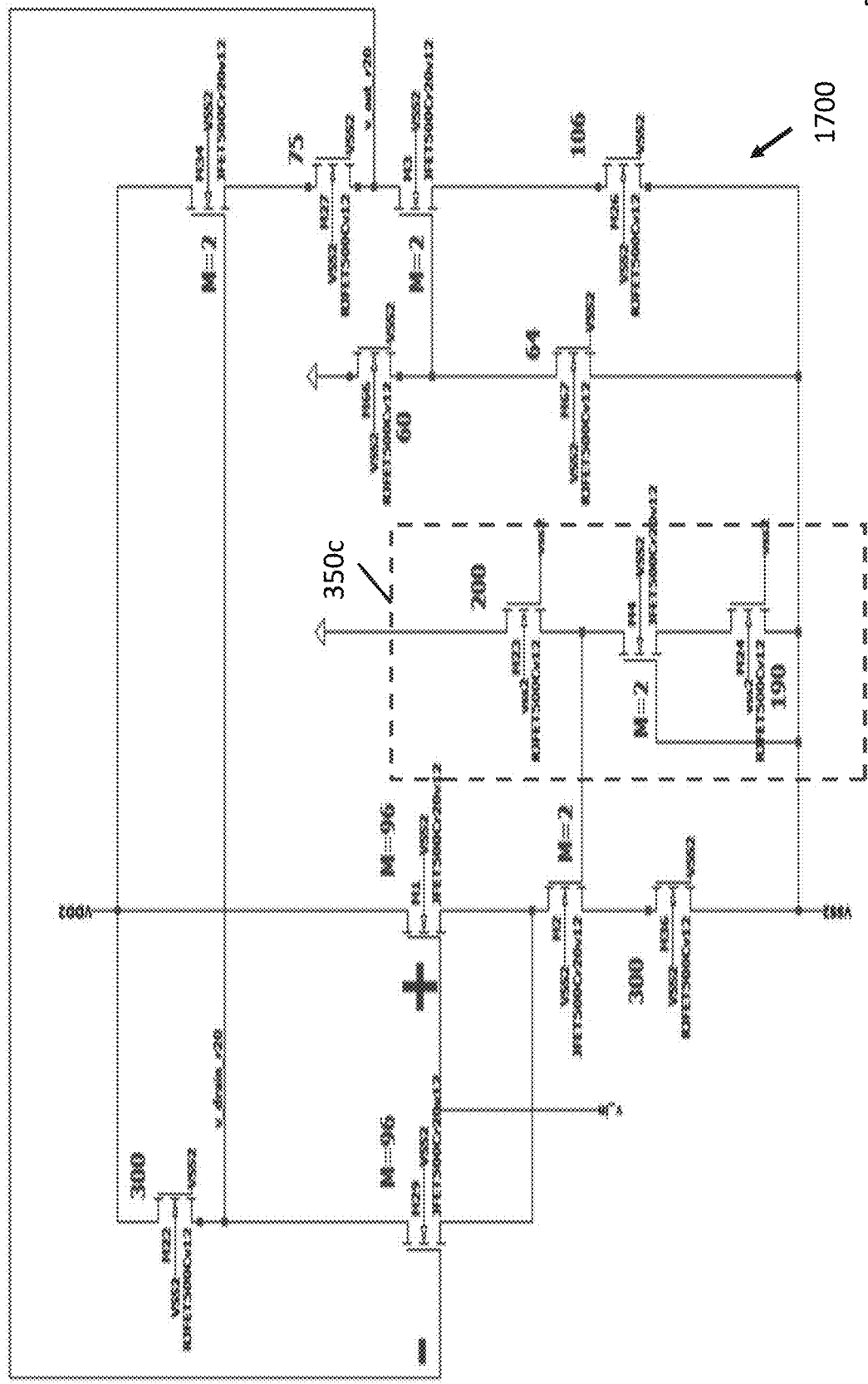
FIG. 17 shows a closed loop amplifier 1700 at T=500° C. and r=20 mm, incorporating the circuit 350c from FIG. 5.

FIGS. 16 and 17 show two examples of closed-loop operational amplifiers according to aspects of the present disclosure. FIG. 16 shows an operational amplifier 1600 at T=500° C. and r=10 mm, incorporating the circuit 340c from FIG. 5. FIG. 17 shows a similar operational amplifier 1700 at T=500° C. and r=20 mm, incorporating the circuit 350c from FIG. 5.

Both amplifiers 1600 and 1700 have a closed loop, unity gain configuration in which the output of the amplifier (v_out_r10 for 1600 and v_out_r20 for 1700) is tied to the inverting input ("−"). The non-inverting inputs ("+") are each driven by a sine wave ("v_in") that is 2V peak-to-peak.

Figure 18:
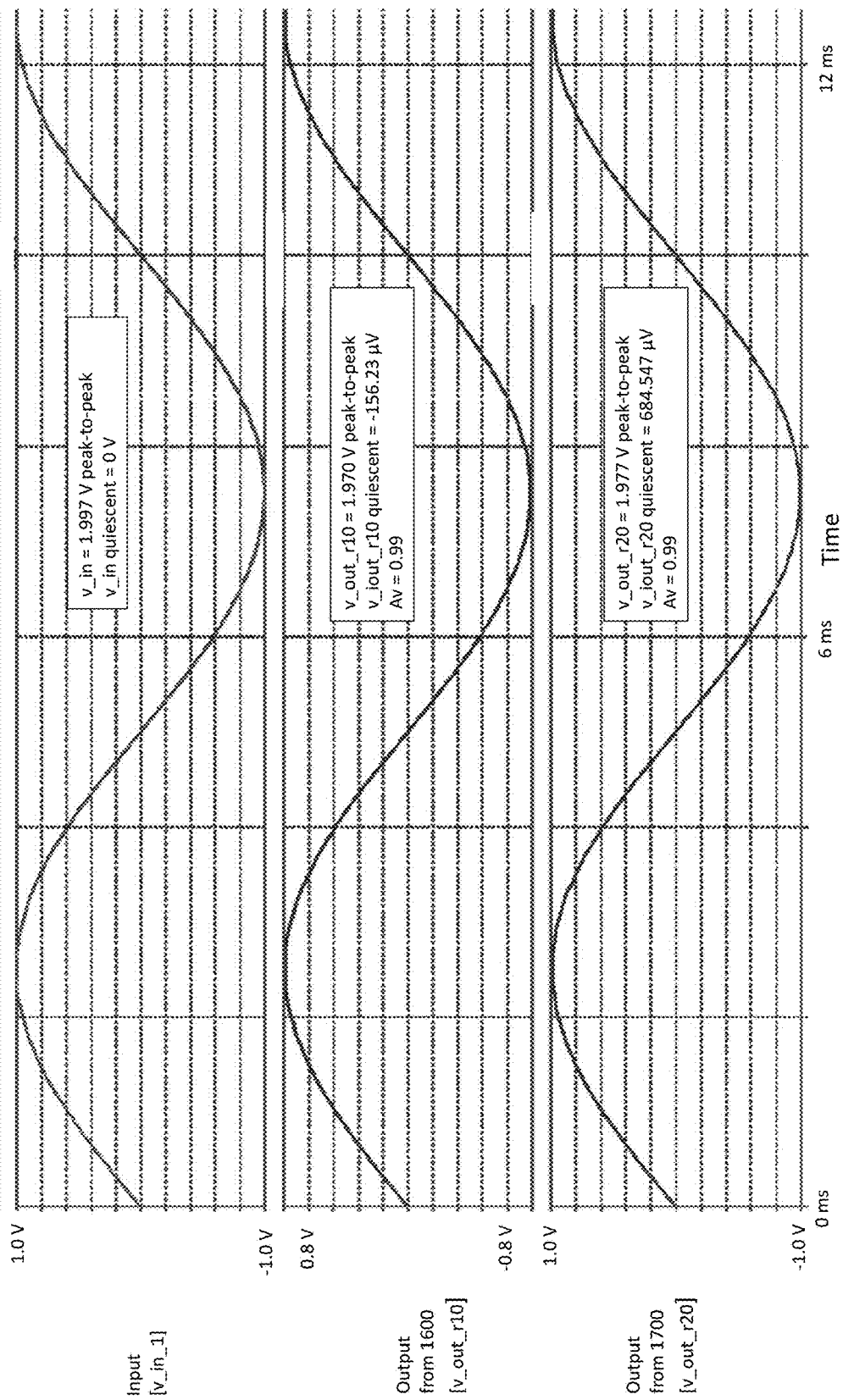
FIG. 18 show the outputs of amplifiers 1600 and 1700 with a 2V peak-to-peak sine wave input.

The input and output signals are shown in FIG. 18. The gain (Av), which is the same for both amplifiers 1600 and 1700, is shown in Table 14.

TABLE 14

Gain (Av) for amplifiers 1600 and 1700 based on three different input signals.

| Input signal | Av for amplifier 1600 (r = 10 mm) | Av for amplifier 1700 (r = 20 mm) |
| --- | --- | --- |
| v_in_1 | 0.99 | 0.99 |

Therefore, these results illustrate that the gain between amplifiers 1600 and 1700, at r=10 mm and 20 mm, respectively, is essentially identical.

Note that gain in the above amplifiers 900, 1100, 1200, 1600, and 1700 is limited by the transistor size. Specifically, we have a practical maximum M at 96 for the present prototype generation of JFET ICs presently under fabrication by NASA. The limitation is due to layout constraints such as maximum device junction area that have been conservatively defined so that parasitic junction leakage currents at 500° C. will not become large enough to interfere with desired signal currents. This limitation may be somewhat overcome by further future improvements to the SiC JFET fabrication technology as well as less-conservative layout rule constraints depending upon the specific circuit and application.

While various inventive aspects, concepts and features of the inventions may be described and illustrated herein as embodied in combination in the exemplary embodiments, these various aspects, concepts and features may be used in many alternative embodiments, either individually or in various combinations and sub-combinations thereof. Unless expressly excluded herein all such combinations and sub-combinations are intended to be within the scope of the present inventions. Still further, while various alternative embodiments as to the various aspects, concepts and features of the inventions—such as alternative materials, structures, configurations, methods, circuits, devices and components, software, hardware, control logic, alternatives as to form, fit and function, and so on-may be described herein, such descriptions are not intended to be a complete or exhaustive list of available alternative embodiments, whether presently known or later developed. Those skilled in the art may readily adopt one or more of the inventive aspects, concepts or features into additional embodiments and uses within the scope of the present inventions even if such embodiments are not expressly disclosed herein. Additionally, even though some features, concepts or aspects of the inventions may be described herein as being a preferred arrangement or method, such description is not intended to suggest that such feature is required or necessary unless expressly so stated. Still further, exemplary or representative values and ranges may be included to assist in understanding the present disclosure, however, such values and ranges are not to be construed in a limiting sense and are intended to be critical values or ranges only if so expressly stated. Still further, exemplary or representative values and ranges may be included to assist in understanding the present disclosure, however, such values and ranges are not to be construed in a limiting sense and are intended to be critical values or ranges only if so expressly stated. Parameters identified as "approximate" or "about" a specified value are intended to include both the specified value and values within 10% of the specified value, unless expressly stated otherwise. Further, it is to be understood that the drawings accompanying the present application may, but need not, be to scale, and therefore may be understood as teaching various ratios and proportions evident in the drawings. Moreover, while various aspects, features and concepts may be expressly identified herein as being inventive or forming part of an invention, such identification is not intended to be exclusive, but rather there may be inventive aspects, concepts and features that are fully described herein without being expressly identified as such or as part of a specific invention, the inventions instead being set forth in the appended claims. Descriptions of exemplary methods or processes are not limited to inclusion of all steps as being required in all cases, nor is the order that the steps are presented to be construed as required or necessary unless expressly so stated.

[P1] https://ntrs.nasa.gov/archive/nasa/casi.ntrs.nasa.gov/20160005307.pdf
Published in Materials Science Forum, vol. 828, pp. 903-907
©Trans Tech Publications

[P2] https://ntrs.nasa.gov/archive/nasa/casi.ntrs.nasa.gov/20180000657.pdf
Published in Materials Science Forum, vol. 924, pp. 962-966
©Trans Tech Publications n the input.

We claim:

1. A method for compensating for device property variations across a wafer comprising:
   determining an output of a first device based on an input;
   determining an output of a second device based on the input, the second device located at a different position with respect to a center of the wafer than a position of the first device with respect to the center of the wafer;
   determining a difference between the output of the first device and the output of the second device, the difference arising at least in part from the difference in position of the first and second devices; and
   altering the first device such that the output of the first device based on the input substantially matches the output of the second device based on the input.

2. The method of claim 1, wherein the altering the first device comprises biasing a voltage input to the first device.

3. The method of claim 1, wherein the altering the first device comprises adding a current source to the first device.

4. The method of claim 1, wherein the first and second devices comprise current sources.

5. The method of claim 1, wherein the first and second devices comprise amplifiers.

6. The method of claim 5, wherein the amplifiers comprise operational amplifiers.

7. The method of claim 1, wherein the difference between the output of the first device and the output of the second device arises at least in part from a difference in a threshold voltage for the first device and a voltage threshold for the second device.

8. The method of claim 7, wherein the outputs of the first and second device depend on drain current $I_d$.

9. The method of claim 1, wherein the output of the first device depends on a gain of the first device and the output of the second device depends on a gain of the second device.

10. The method of claim 1, wherein the altering comprises compensating for a difference in body effect in the first device and the body effect in the second device.

11. The method of claim 10, wherein the altering comprises trimming resistors.

12. The method of claim 11, wherein:
   the first and second devices comprise resistors more subject to the body effect than other resistors; and
   the trimming comprises decreasing the resistance of the resistors more subject to the body effect.

13. The method of claim 10, wherein the altering increases a drain current $I_d$.

14. The method of claim 10, wherein the altering comprises augmenting the resistance of resistors.

15. The method of claim 14, wherein:
   the first and second devices comprise resistors more subject to the body effect than other resistors; and
   the augmenting comprises increasing the resistance of the resistors less subject to the body effect.

16. The method of claim 15, wherein the altering decreases a drain current $I_d$.

17. The method of claim 1, wherein the wafer comprises SiC.

18. The method of claim 1, wherein the difference between the output of the first device and the output of the second device arises at least in part from inhomogeneities in the wafer.

19. The method of claim 1, wherein the difference between the output of the first device and the output of the second device arises at least in part from inhomogeneities in layers deposited on the wafer.

20. The method of claim 1, wherein the altering is based on compensating for differences in properties of the wafer at the position of the first device from properties of the wafer at the position of the second device.

* * * * *